(12) United States Patent
Kataoka

(10) Patent No.: US 11,676,673 B2
(45) Date of Patent: Jun. 13, 2023

(54) SEMICONDUCTOR MEMORY DEVICE AND METHOD OF CONTROLLING SEMICONDUCTOR MEMORY DEVICE

(71) Applicant: Kioxia Corporation, Tokyo (JP)

(72) Inventor: Hideyuki Kataoka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 84 days.

(21) Appl. No.: 17/344,000

(22) Filed: Jun. 10, 2021

(65) Prior Publication Data

US 2022/0270693 A1 Aug. 25, 2022

(30) Foreign Application Priority Data

Feb. 19, 2021 (JP) .............................. JP2021-024957

(51) Int. Cl.
*G11C 16/00* (2006.01)
*G11C 16/34* (2006.01)
*G11C 16/10* (2006.01)
*G11C 16/26* (2006.01)
*G11C 7/10* (2006.01)
(Continued)

(52) U.S. Cl.
CPC ........ *G11C 16/3459* (2013.01); *G11C 7/1048* (2013.01); *G11C 16/0433* (2013.01);
(Continued)

(58) Field of Classification Search
CPC ..... G11C 16/0483; G11C 16/10; G11C 16/16; G11C 16/08; G11C 16/26; G11C 16/32; G11C 16/3445; G11C 7/06; G11C 16/14; G11C 16/30; G11C 8/14; G11C 11/223; G11C 11/2255; G11C 11/2259; G11C 11/2275; G11C 11/2277; G11C 11/5628; G11C 11/5635; G11C 11/5657; G11C 16/12; G11C 16/28; G11C 16/3409; G11C 16/3459; G11C 2211/5648; G11C 5/06; G11C 5/147; G11C 7/04; G11C 7/1039; G11C 7/18; G11C 16/24; G11C 8/08;
(Continued)

(56) References Cited

U.S. PATENT DOCUMENTS 8,174,902 B2 5/2012 Lee et al.
10,490,278 B2 * 11/2019 Kimura ................. G11C 16/16
(Continued)

FOREIGN PATENT DOCUMENTS

CN 110390971 A 10/2019
JP 2013109804 A 6/2013

*Primary Examiner* — Thong Q Le
(74) *Attorney, Agent, or Firm* — Holtz, Holtz & Volek PC

(57) ABSTRACT

According to one embodiment, a semiconductor memory device includes: first and second select transistors; first and second select gate lines; first and second interconnects; first and second memory cell transistors; and first and second word lines. In a write operation, after execution of a verify operation, in a period in which the second select transistor is ON, a voltage of the first word line changes from a first voltage to a second voltage and a voltage of the second word line changes from a third voltage applied in the verify operation to a fourth voltage, and after the voltage of the first word line changes to the second voltage and the voltage of the second word line changes to the fourth voltage, a voltage of the second select gate line changes from a fifth voltage to a sixth voltage.

13 Claims, 14 Drawing Sheets

(51) Int. Cl.
   *G11C 16/24* (2006.01)
   *G11C 16/30* (2006.01)
   *G11C 16/04* (2006.01)
   *G11C 16/08* (2006.01)

(52) U.S. Cl.
   CPC ............ *G11C 16/08* (2013.01); *G11C 16/102* (2013.01); *G11C 16/24* (2013.01); *G11C 16/26* (2013.01); *G11C 16/30* (2013.01)

(58) Field of Classification Search
   CPC ........... H01L 27/11582; H01L 27/1157; H01L 27/11578; H01L 27/11519; H01L 27/11556; H01L 27/11565
   USPC ............ 365/185.17, 185.29, 185.28, 185.18, 365/185.11, 184, 185.02, 185.22, 185.05, 365/185.2, 185.21, 185.26, 185.27, 365/185.33, 218, 148, 185.12, 185.13, 365/185.14, 185.15, 185.25, 189.04, 222, 365/63, 154, 185.03, 185.09, 185.19, 365/185.23, 185.24, 185.3, 189.05, 365/189.09, 195, 226
   See application file for complete search history.

(56) References Cited

U.S. PATENT DOCUMENTS

| | | |
|---|---|---|
| 10,629,267 B2 | 4/2020 | Lee et al. |
| 2013/0128673 A1 | 5/2013 | Terada et al. |
| 2019/0318784 A1 | 10/2019 | Lee et al. |

* cited by examiner

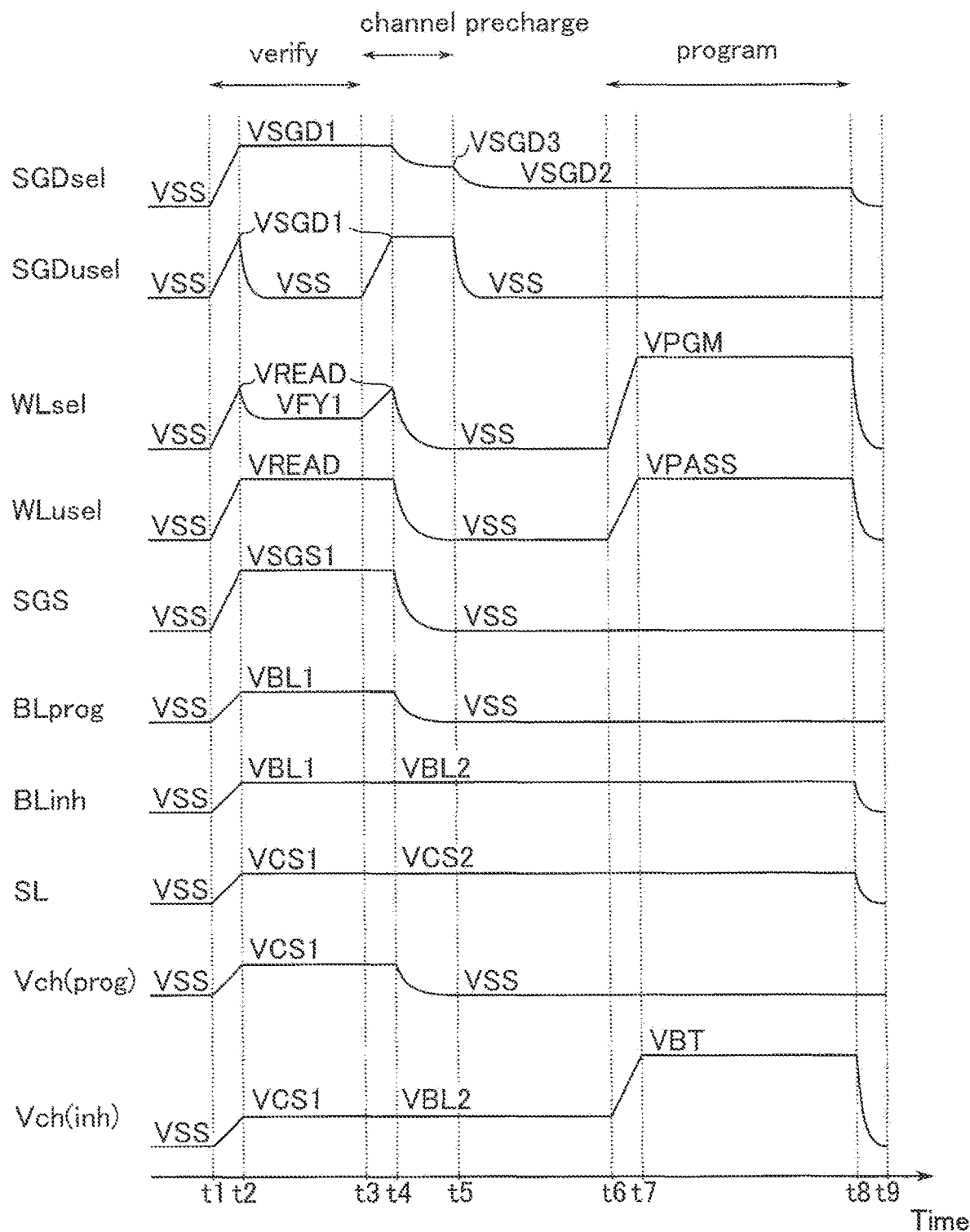
F I G. 12

SEMICONDUCTOR MEMORY DEVICE AND METHOD OF CONTROLLING SEMICONDUCTOR MEMORY DEVICE

CROSS-REFERENCE TO RELATED APPLICATIONS

This application is based upon and claims the benefit of priority from Japanese Patent Application No. 2021-024957, filed Feb. 19, 2021, the entire contents of which are incorporated herein by reference.

FIELD

Embodiments described herein relate generally to a semiconductor memory device and a method of controlling the semiconductor memory device.

BACKGROUND

As a semiconductor memory device, a NAND flash memory is known.

BRIEF DESCRIPTION OF THE DRAWINGS

FIG. 12 is a timing chart showing voltages of various interconnects, etc. in a write operation of a semiconductor memory device according to a sixth embodiment.

DETAILED DESCRIPTION

Figure 1:
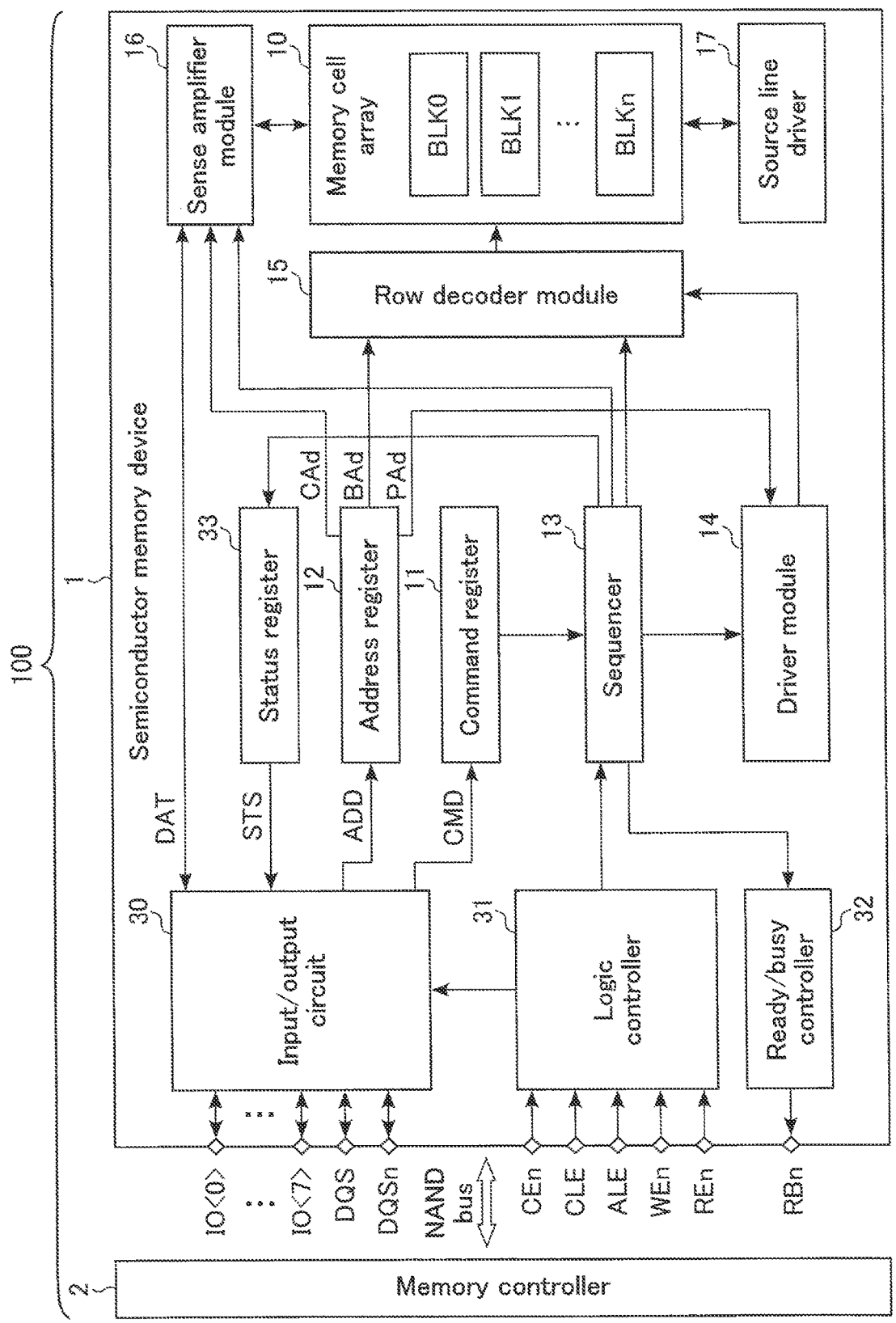
FIG. 1 is a block diagram of a memory system including a semiconductor memory device according to a first embodiment.

In general, according to one embodiment, a semiconductor memory device includes: a first select transistor; a first select gate line coupled to a gate of the first select transistor; a first interconnect coupled to the first select transistor; a second select transistor; a second select gate line coupled to a gate of the second select transistor; a second interconnect coupled to the second select transistor; first and second memory cell transistors coupled between the first select transistor and the second select transistor; a first word line coupled to the first memory cell transistor; and a second word line coupled to the second memory cell transistor. In a write operation on the first memory cell transistor which includes a program operation and a verify operation, after execution of the verify operation, in a period in which the second select transistor is ON, a voltage of the first word line changes from a first voltage to a second voltage and a voltage of the second word line changes from a third voltage, which is applied in the verify operation, to a fourth voltage, and after the voltage of the first word line changes to the second voltage and the voltage of the second word line changes to the fourth voltage, a voltage of the second select gate line changes from a fifth voltage to a sixth voltage which turns off the second select transistor.

Hereinafter, embodiments will be described with reference to the accompanying drawings. For the description, common parts are assigned common reference numerals or symbols throughout the drawings.

In the following description, a signal X<p:0> (where p is a natural number) is a (p+1)-bit signal, and refers to a set of signals X<0>, X<1>, . . . , X<p>, each of which is a 1-bit signal. Of the signal X<p:0>, i.e., (p+1)-bit digital signal, X<p> will be referred to as a most significant bit, and X<0> will be referred to as a least significant bit.

[1] First Embodiment

A semiconductor memory device according to a first embodiment will be described.

[1-1] Configuration

[1-1-1] Overall Configuration of Memory System

An overall configuration of a memory system including the semiconductor memory device according to the present embodiment will be described with reference to FIG. 1. FIG. 1 is a block diagram showing the memory system including the semiconductor memory device according to the present embodiment. In FIG. 1, some of the couplings between the blocks are indicated by arrows; however, the couplings between the blocks are not limited to those shown in FIG. 1.

A memory system 100 includes a semiconductor memory device 1 and a memory controller 2.

The semiconductor memory device 1 is a NAND flash memory, which can nonvolatilely store data, and can be controlled by the memory controller 2. The semiconductor memory device 1 includes a memory cell array 10, a command register 11, an address register 12, a sequencer 13, a driver module 14, a row decoder module 15, a sense amplifier module 16, a source line driver 17, an input/output circuit 30, a logic controller 31, a ready/busy controller 32, and a status register 33.

The input/output circuit 30 transmits and receives an input/output signal IO<7:0>, a data strobe signal DQS, and a data strobe signal DQSn (signal obtained by inverting the signal DQS) to and from the memory controller 2. Details of the signals IO, DQS, and DQSn will be described later. The input/output circuit 30 may receive the signals DQS and DQSn from the memory controller 2 via the logic controller 31. The input/output circuit 30 transmits a command CMD in the signal IO<7:0> to the command register 11. The input/output circuit 30 transmits address information ADD in the signal IO<7:0> to the address register 12. The input/output circuit 30 receives status information STS from the status register 33. The input/output circuit 30 transmits and receives data DAT in the signal IO<7:0> to and from the sense amplifier module 16.

The logic controller 31 receives, from the memory controller 2, a chip enable signal CEn, a command latch enable signal CLE, an address latch enable signal ALE, a write enable signal WEn, and a read enable signal REn. Details of the signals CEn, CLE, ALE, WEn, and REn will be described later. The logic controller 31 controls the input/output circuit 30 and the sequencer 13 in accordance with the received signal.

The ready/busy controller 32 transmits a ready/busy signal RBn to the memory controller 2 in accordance with the operation status of the sequencer 13. Details of the signal RBn will be described later.

The memory cell array 10 includes a plurality of blocks BLK0 to BLKn (where n is a natural number not less than 1). The block BLK includes a set of memory cells that can nonvolatilely store data, and is used as, for example, a data erase unit. A plurality of bit lines and a plurality of word lines are provided in the memory cell array 10. Each memory cell is associated with, for example, one bit line and one word line. Details of the memory cell array 10 will be described later.

The command register 11 stores a command CMD received by the semiconductor memory device 1 from the memory controller 2. The command CMD includes an order to cause the sequencer 13 to execute a read operation, a write operation, an erase operation, or the like.

The address register 12 stores address information ADD received by the semiconductor memory device 1 from the memory controller 2. The address information ADD includes, for example, a block address BAd, a page address PAd, and a column address CAd. The block address BAd, page address PAd, and column address CAd are used to select, for example, a block BLK, word line, and bit line, respectively.

The status register 33 temporarily stores status information STS on a read operation, a write operation, an erase operation, or the like, and notifies the memory controller 2 whether or not the operation has been normally completed.

The sequencer 13 controls the overall operation of the semiconductor memory device 1. For example, the sequencer 13 controls the driver module 14, the row decoder module 15, the sense amplifier module 16, the ready/busy controller 32, and the like, based on the command CMD stored in the command register 11, to execute a read operation, a write operation, an erase operation, and the like.

The driver module 14 generates voltages used in a read operation, a write operation, an erase operation, and the like. The driver module 14 applies a generated voltage to a signal line corresponding to a selected word line, based on the page address PAd stored in the address register 12.

The row decoder module 15 selects one block BLK in the memory cell array 10, based on the block address BAd stored in the address register 12. The row decoder module 15 transfers the voltage applied to the signal line corresponding to the selected word line to the selected word line in the selected block BLK.

In a write operation, the sense amplifier module 16 applies, to a bit line, a voltage corresponding to write data DAT received from the input/output circuit 30. In a read operation, the sense amplifier module 16 determines data stored in a memory cell based on the voltage of the corresponding bit line, and transfers a result of the determination to the input/output circuit 30 as read data DAT.

The sense amplifier module 16 includes a plurality of sense amplifier units SAU (not shown). Each sense amplifier unit SAU includes a plurality of latch circuits. The sense amplifier units SAU are coupled to the respective bit lines BL. Each sense amplifier unit SAU transmits and receives data DAT to and from the input/output circuit 30.

The source line driver 17 generates voltages used in a read operation, a write operation, an erase operation, and the like, and applies a generated voltage to the source line.

The semiconductor memory device 1 configured as described above is coupled to the memory controller 2 via a NAND bus. The NAND bus performs signal transmission/reception compliant with a NAND interface. Examples of the signal transmitted and received between the semiconductor memory device 1 and the memory controller 2 are the signals CEn, CLE, ALE, WEn, REn, RBn, and IO and the signals DQS and DQSn. The memory controller 2 controls the semiconductor memory device 1 using these signals.

The signal CEn is a signal for enabling the semiconductor memory device 1. The signal CLE is a signal indicating that the signal IO received by the semiconductor memory device 1 is a command CMD. The signal ALE is a signal indicating that the signal IO received by the semiconductor memory device 1 is address information ADD. The signal WEn is a signal ordering the semiconductor memory device 1 to input a signal IO therein. The signal REn is a signal ordering the semiconductor memory device 1 to output a signal IO therefrom. The signals CEn, CLE, ALE, WEn, and REn are transmitted from the memory controller 2 to the semiconductor memory device 1.

The signal RBn is a signal indicating which of a ready state and a busy state the semiconductor memory device 1 is in, and is, for example, at an "L" level when the semiconductor memory device 1 is in the busy state. The ready state is a state in which the semiconductor memory device 1 can accept a command from the memory controller 2. The busy state is a state in which the semiconductor memory device 1 cannot accept a command from the memory controller 2. The signal RBn is transmitted from the semiconductor memory device 1 to the memory controller 2.

The signal IO is, for example, an 8-bit signal IO<7:0>. The signal IO is an entity of data transmitted and received between the semiconductor memory device 1 and the memory controller 2, and is, for example, a command CMD, address information ADD, status information STS, or data DAT.

The signals DQS and DQSn are used to, for example, control the transmission and reception timing of the signal IO. For example, when data is written, signals DQS and DQSn are transmitted together with write data IO from the memory controller 2 to the semiconductor memory device 1. The signals DQS and DQSn are toggled, and the semiconductor memory device 1 receives the write data IO in sync with the signals DQS and DQSn. When data is read, signals DQS and DQSn are transmitted together with read data IO from the semiconductor memory device 1 to the memory controller 2. The signals DQS and DQSn are generated based on the signal REn. The signals DQS and DQSn are toggled, and the memory controller 2 receives the read data IO in sync with the signals DQS and DQSn.

The memory controller 2 is coupled to a host device (not shown) via a host bus (not shown). The memory controller 2 controls the semiconductor memory device 1, based on a request signal received from the host device, for example. The host device is, for example, a digital camera or a personal computer, and the host bus is, for example, a bus compliant with an SD™ interface.

The above-described semiconductor memory device 1 and memory controller 2 may constitute a single semiconductor device in combination. Examples of such a semiconductor device include a memory card such as an SD™ card, and a solid state drive (SSD).

(1-1-2) Circuit Configuration of Memory Cell Array 10

Figure 2:
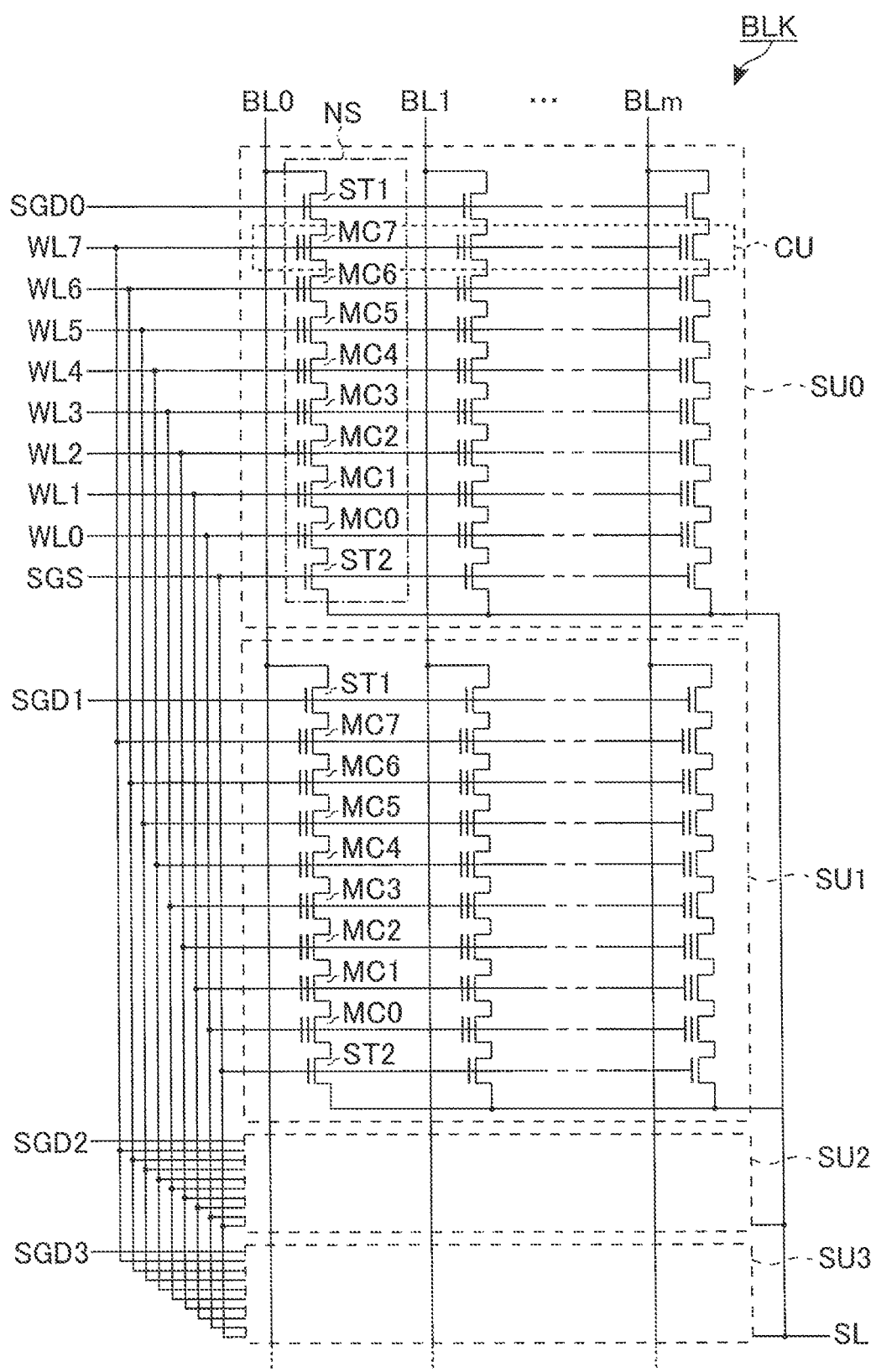
FIG. 2 is a circuit diagram of a memory cell array included in the semiconductor memory device according to the first embodiment.

A circuit configuration of the memory cell array 10 will be described with reference to FIG. 2. FIG. 2 is a circuit diagram of the memory cell array 10 included in the semiconductor memory device 1 according to the present embodiment. FIG. 2 shows an example of the circuit configuration of the memory cell array 10 by representatively showing one of a plurality of blocks BLK included in the memory cell array 10. All of the other blocks BLK also have the configuration shown in FIG. 2.

The block BLK includes, for example, four string units SU0 to SU3. Each string unit SU includes a plurality of NAND strings NS associated with bit lines BL0 to BLm (where m is a natural number not less than 1), respectively. Each NAND string NS includes, for example, memory cell transistors MC0 to MC7 and select transistors ST1 and ST2. Each of the memory cell transistors MC includes a control gate and a charge storage layer, and nonvolatilely stores data. Each of the select transistors ST1 and ST2 is used to select a string unit SU in various operations.

In each NAND string NS, the memory cell transistors MC0 to MC7 are coupled in series. The drain of the select transistor ST1 is coupled to a corresponding bit line BL. The source of the select transistor ST1 is coupled to one end of a series of memory cell transistors MC0 to MC7. The drain of the select transistor ST2 is coupled to the other end of the series of the memory cell transistors MC0 to MC7. The source of the select transistor ST2 is coupled to a source line SL.

The control gates of the memory cell transistors MC0 to MC7 in the same block BLK are coupled in common to respective word lines WL0 to WL7. The gates of the select transistors ST1 in the string units SU0 to SU3 are coupled in common to respective select gate lines SGD0 to SGD3. The gates of the select transistors ST2 in the same block BLK are coupled in common to a select gate line SGS.

In the above-described circuit configuration of the memory cell array 10, a bit line BL is shared by, for example, NAND strings NS to which the same column address CAd is assigned in the respective string units SU. The source line SL is shared by, for example, a plurality of blocks BLK.

A set of memory cell transistors MC coupled to a common word line WL in one string unit SU is referred to as, for example, a cell unit CU. The storage capacity of the cell unit CU including memory cell transistors MC each configured to store 1-bit data is defined as, for example, "1-page data". The cell unit CU may have a storage capacity of 2 or more-page data in accordance with the number of bits of data stored in each memory cell transistor MC.

The circuit configuration of the memory cell array 10 is not limited to the above-described one. For example, the number of string units SU in each block BLK and the number of memory cell transistors MC and select transistors ST1 and ST2 in each NAND string NS may be any numbers.

[1-1-3] Structure of Memory Cell Array 10

Figure 3:
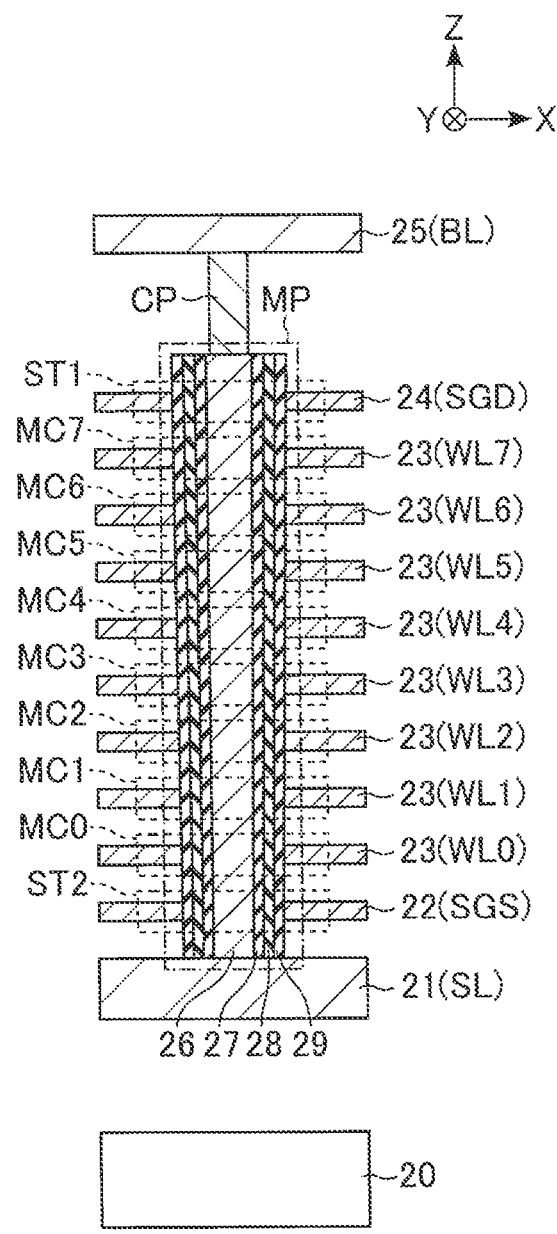
FIG. 3 is a cross-sectional view of the memory cell array included in the semiconductor memory device according to the first embodiment.

A structure of the memory cell array 10 will be described with reference to FIG. 3. FIG. 3 is a cross-sectional view of the memory cell array 10 included in the semiconductor memory device 1 according to the present embodiment. FIG. 3 shows an example of the cross-section structure of the memory cell array 10 by representatively showing a partial region of a block BLK. In the cross-sectional views to be referred to below, constituent elements such as an insulating layer (interlayer insulating film), an interconnect, and a contact are omitted as appropriate for better visibility.

The region where the memory cell array 10 is formed includes a semiconductor substrate 20, conductive layers 21 to 25, a memory pillar MP, and a contact CP.

The surface of the semiconductor substrate 20 is parallel with the XY plane. A conductive layer 21 is provided above the semiconductor substrate 20 with an insulating layer interposed therebetween. The conductive layer 21 has, for example, a plate-like shape expanding along the XY plane, and is used as a source line SL. Although not shown, circuits such as a sense amplifier module 16 are provided in the region between the semiconductor substrate 20 and the conductive layer 21. The conductive layer 21 contains, for example, phosphorous-doped silicon.

Above the conductive layer 21, a conductive layer 22 is provided with an insulating layer interposed therebetween. The conductive layer 22 has, for example, a plate-like shape expanding along the XY plane, and is used as a select gate line SGS. The conductive layer 22 contains, for example, phosphorous-doped silicon.

Above the conductive layer 22, an insulating layer and a conductive layer 23 are alternately stacked. Each conductive layer 23 has, for example, a plate-like shape expanding along the XY plane. A plurality of stacked conductive layers 23 are used as word lines WL0 to WL7 in the order from the semiconductor substrate 20 side. The conductive layers 23 contain, for example, tungsten.

Above the topmost conductor layer 23, a conductive layer 24 is provided with an insulating layer interposed therebetween. The conductive layer 24 has, for example, a plate-like shape expanding along the XY plane, and is used as a select gate line SGD. The conductive layer 24 contains, for example, tungsten.

Above the conductive layer 24, a conductive layer 25 is provided with an insulating layer interposed therebetween. The conductive layer 25 has, for example, a linear shape extending in the X-direction, and is used as a bit line BL. That is, a plurality of conductive layers 25 are aligned in the Y-direction in a region that is not shown. The conductive layer 25 contains, for example, copper.

The memory pillar MP corresponds to a NAND string NS. The memory pillar MP has, for example, a columnar shape extending in the Z-direction, and passes through the conductive layers 22 to 24. The upper end of the memory pillar MP is included in, for example, a layer between the layer in which the conductive layer 24 is provided and the layer in which the conductive layer 25 is provided. The lower end of the memory pillar MP is, for example, in contact with the conductive layer 21.

The memory pillar MP includes a semiconductor member 26 and insulating layers 27 to 29.

The semiconductor member 26 has a columnar shape extending in the Z-direction in the center of the memory pillar MP. The semiconductor member 26 functions as a channel of each of the memory cell transistors MC and select transistors ST1 and ST2.

The side surface of the semiconductor member 26 is covered with a layer stack constituted by the insulating layers 27 to 29. The insulating layer 27 is in contact with the semiconductor member 26, and surrounds the side surface of the semiconductor member 26. The insulating layer 27 functions as a tunnel insulating film of each memory cell transistor MC.

The insulating layer 28 is in contact with the insulating layer 27, and surrounds the side surface of the insulating layer 27. The insulating layer 28 functions as a charge storage layer of each memory cell transistor MC.

The insulating layer 29 is in contact with the insulating layer 28, and surrounds the side surface of the insulating layer 28. The insulating layer 29 functions as a block insulating film of each memory cell transistor MC.

A columnar contact CP is provided on the semiconductor member 26. The upper surface of the contact CP is in contact with one conductive layer 25, i.e., one bit line BL. The memory pillar MP may be electrically coupled to the conductive layer 25 via two or more contacts or another interconnect.

In the above-described configuration of the memory pillar MP, for example, the intersection of the memory pillar MP and the conductive layer 22 functions as a select transistor ST2. The intersections of the memory pillar MP and the respective conductive layers 23 function as memory cell transistors MC0 to MC7. The intersection of the memory pillar MP and the conductive layer 24 functions as a select transistor ST1.

[1-2] Write Operation

A write operation of the semiconductor memory device 1 according to the present embodiment will be described. The semiconductor memory device 1 according to the present embodiment sequentially executes write operations on the memory cell transistors MC in each NAND string NS from the select transistor ST1 side to the select transistor ST2 side. In other words, the semiconductor memory device 1 according to the present embodiment sequentially executes write operations on cell units CU in each string unit SU from the bit line BL side. Hereinafter, a word line associated with a selected cell unit CU will be referred to as WLsel, and a word line associated with an unselected cell unit CU will be referred to as WLusel. A select gate line associated with a selected string unit SU will be referred to as SGDsel, and a select gate line associated with an unselected string unit SU will be referred to as SGDusel.

[1-2-1] Overview of Write Operation

An overview of a write operation will be described. A write operation roughly consists of a program operation and a verify operation.

The program operation is an operation of raising the threshold voltage by injecting electrons into the charge storage layer (or maintaining the threshold voltage by inhibiting the injection). A program voltage VPGM is applied to the word line WLsel. The voltage VPGM is a high voltage capable of raising the threshold voltages of the corresponding memory cell transistors MC. Hereinafter, the operation of raising the threshold voltage will be referred to as a "0" program. A bit line BL determined as a subject of the "0" program is supplied with a voltage (such as a ground voltage VSS) corresponding to the "0" program from the sense amplifier module 16. The operation of maintaining the threshold voltage will be referred to as a "1" program or a write inhibit. A bit line BL determined as a subject of the "1" program is supplied with a voltage (hereinafter referred to as a "voltage VBL") corresponding to the "1" program from the sense amplifier module 16. Hereinafter, a bit line corresponding to the "0" program will be referred to as BLprog, and a bit line corresponding to the "1" program will be referred to as BLinh. A NAND string NS coupled to a bit line BLprog in a selected string unit SU will be referred to as a "NAND string NSprog", and a NAND string NS coupled to a bit line BLinh in a selected string unit SU will be referred to as a "NAND string NSinh".

The verify operation is an operation of reading data after a program operation, and determining whether or not the threshold voltage of the memory cell transistor MC has reached a target level. Hereinafter, the case where the threshold voltage of the memory cell transistor MC has reached the target level will be described as "verification has passed", whereas the case where the threshold voltage of the memory cell transistor MC has not reached the target level will be described as "verification has failed".

A combination of the program operation and the verify operation (hereinafter referred to as a "program loop") will be repeatedly executed until the threshold voltage of the memory cell transistor MC reaches the target level. Every time the program loop is repeated, the set value of the voltage VPGM is stepped up. In the semiconductor memory device 1 of the present embodiment, a channel precharge operation can be executed during the program loop.

The channel precharge operation is an operation of raising a channel voltage before execution of a program operation. For example, the channel precharge operation is executed when the stepped-up set value of the voltage VPGM exceeds a reference value set in advance. The semiconductor memory device 1 according to the present embodiment precharges the channel in each NAND string NS with a voltage from the source line SL.

[1-2-2] Flowchart of Write Operation

Figure 4:
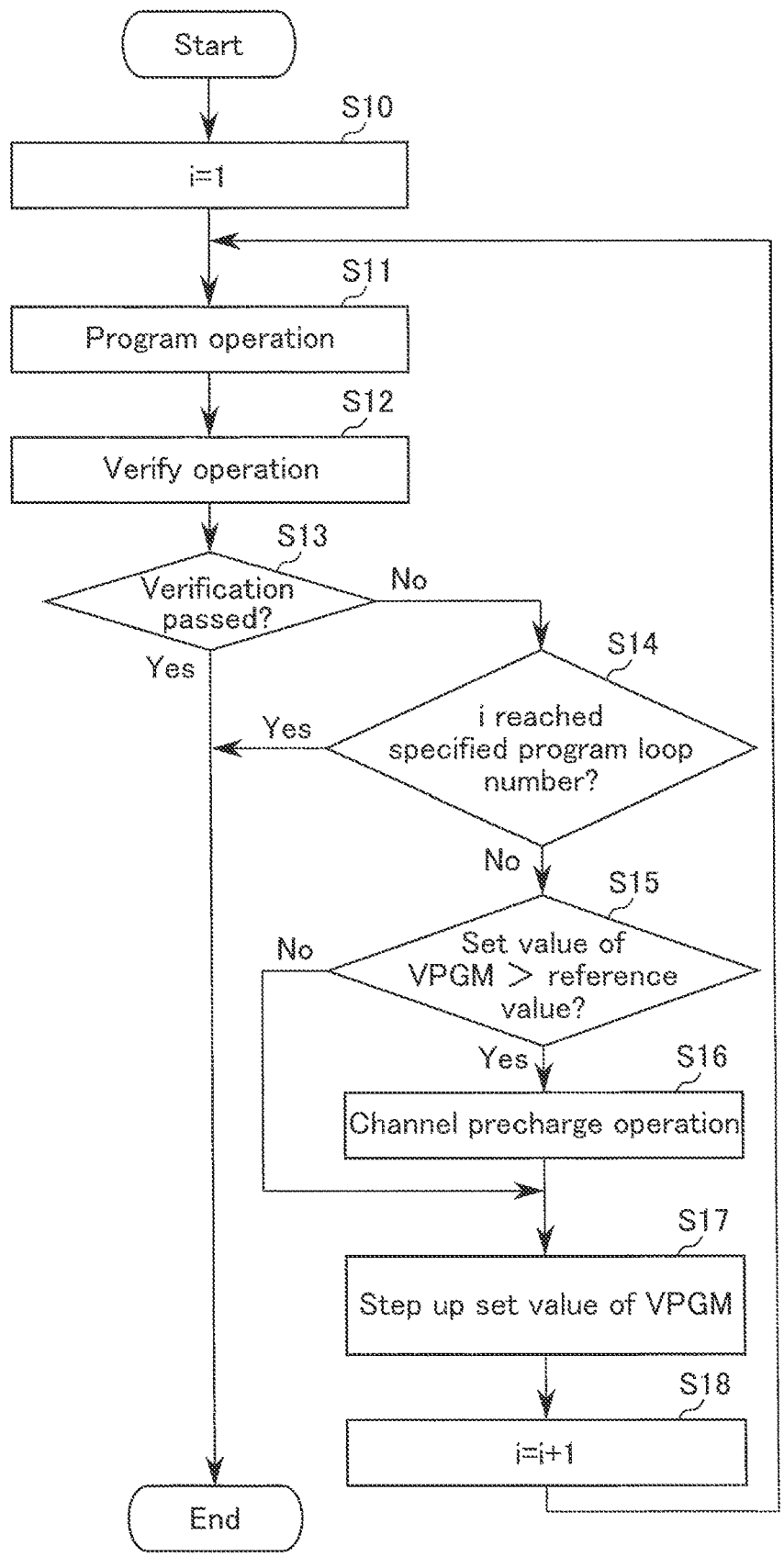
FIG. 4 is a flowchart showing a write operation of the semiconductor memory device according to the first embodiment.

A flow of a write operation will be described with reference to FIG. 4. FIG. 4 is a flowchart showing a write operation of the semiconductor memory device 1 according to the present embodiment. In FIG. 4, the program loop number is represented by i (where i is a natural number not less than 1).

The semiconductor memory device 1 receives, from the memory controller 2, a command CMD that orders a write operation, address information ADD, and write data. The command CMD is transferred to the command register 11. The address information ADD is transferred to the address register 12. The write data is transferred to a latch circuit in the sense amplifier unit SAU.

When the command CMD is stored in the command register 11, the address information ADD is stored in the address register 12, and the write data is stored in the latch circuit in the sense amplifier unit SAU, the semiconductor memory device 1 starts a write operation.

The sequencer 13 sets i to 1 (S10).

The sequencer 13 then executes a program operation (S11).

Upon completion of the program operation, the sequencer 13 executes a verify operation (S12).

When it is determined verification has passed in S12 (Yes in S13), the sequencer 13 terminates the write operation. When it is determined verification has failed in S12 (No in S13), the sequencer 13 determines whether or not i has reached a specified program loop number (S14).

When it is determined i has reached the specified program loop number (Yes in S14), the sequencer 13 terminates the write operation. When it is determined i has not reached the specified program loop number (No in S14), the sequencer 13 determines whether or not the set value of the voltage VPGM exceeds a reference value (S15). The reference value is a value for determining whether or not to execute a channel precharge operation.

When it is determined that the set value of the voltage VPGM exceeds the reference value (Yes in S15), the sequencer 13 executes a channel precharge operation (S16).

Upon completion of the channel precharge operation, the sequencer 13 steps up the set value of the voltage VPGM (S17). Namely, the voltage VPGM applied to the word line WLsel increases as the number of executed program loops increases. The step-up width of the voltage VPGM may be set to any value.

Upon completion of the step-up of the set value of the voltage VPGM, the sequencer 13 increments i to i+1 (S18), and proceeds to S11, mentioned above.

When it is determined that the set value of the voltage VPGM does not exceed the reference value (No in S15), the sequencer 13 proceeds to S17, mentioned above, without executing the channel precharge operation.

[1-2-3] Voltages of Various Interconnects, Etc. in Write Operation

Figure 5:
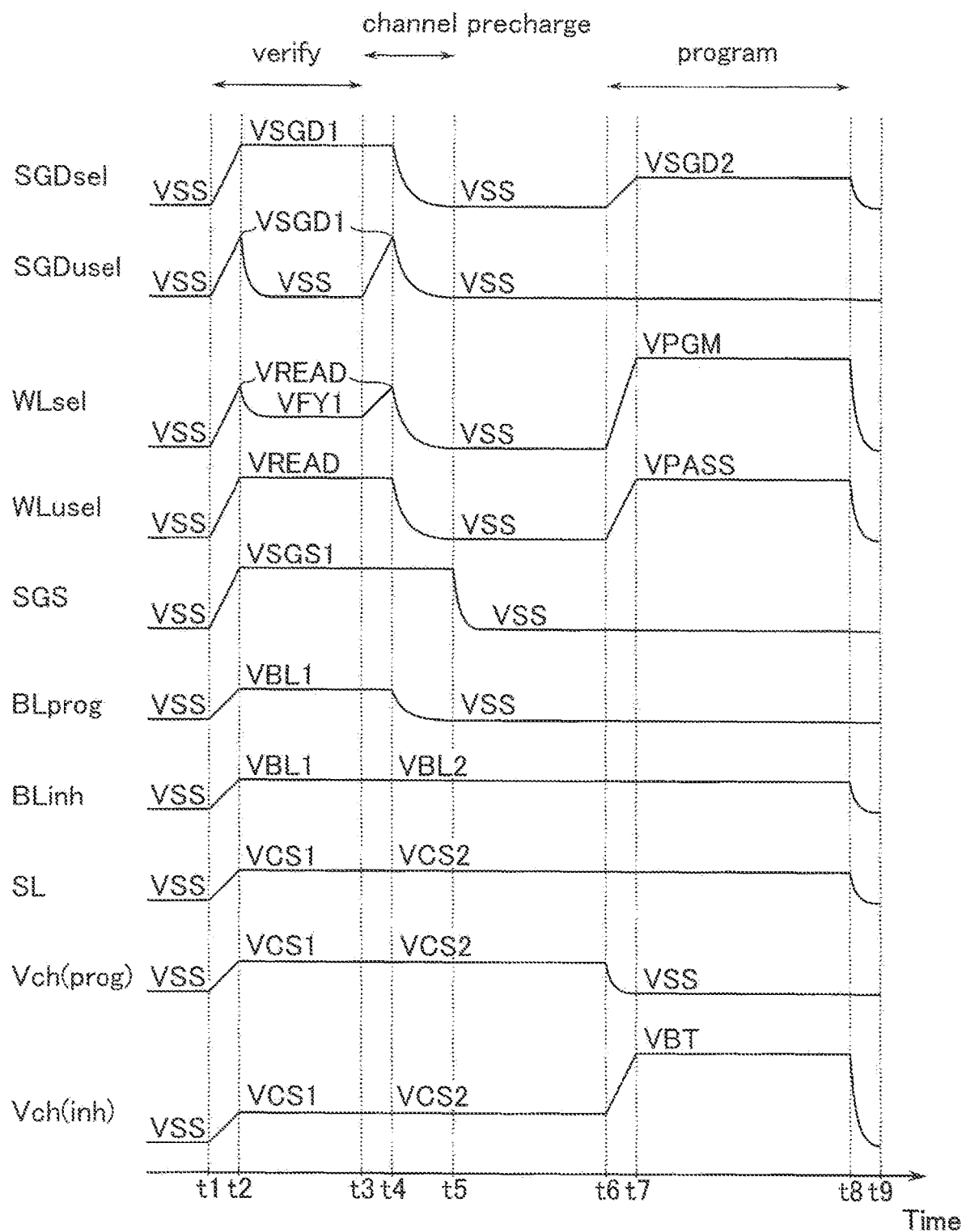
FIG. 5 is a timing chart showing voltages of various interconnects, etc. in a write operation of the semiconductor memory device according to the first embodiment.

Voltages of various interconnects, etc. in a write operation will be described with reference to FIG. 5. FIG. 5 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the source line SL in a state where the memory cell transistors MC6 and MC7 have been programmed and the memory cell transistors MC0 to MC5 have not been programmed. The threshold voltage of a "0"-programmed memory cell transistor MC is a positive voltage, and the threshold voltage of a "1"-programmed memory cell transistor MC is a negative voltage. Hereinafter, the case where the threshold voltages of the memory cell transistors MC6 and MC7 are positive voltages will be described to simplify the description. The threshold voltages of the non-programmed memory cell transistors MC0 to MC5 are negative voltages. Let us assume that, before execution of the verify operation in the i-th program loop, the voltages of the select gate lines SGDsel and SGDusel, word lines WLsel and WLusel, select gate line SGS, bit lines BLprog and BLinh, and source line SL, the channel voltage of the NAND string NSprog (hereinafter referred to as "Vch(prog)", and the channel voltage of the NAND string NSinh (hereinafter referred to as "Vch(inh)" are each VSS (for example, 0 V).

The sequencer 13 sequentially executes the operations from time t1 to time t9. For example, the period from time t1 to time t3 corresponds to the i-th verify operation. The period from time t3 to time t5 corresponds to the channel precharge operation. The period from time t5 to time t6 corresponds to a precharge recovery operation. The precharge recovery operation is a combined operation of a termination operation of the precharge operation and a preparation operation of the program operation. The period from time t6 to time t8 corresponds to the (i+1)-th program operation. The period from time t8 to time t9 corresponds to a program recovery operation. Each of the verify operation, channel precharge operation, and program operation will be described with reference to FIG. 5.

(Verity Operation)

At time t1, the row decoder module 15 applies a voltage VSGD1 to each of the select gate lines SGDsel and SGDusel. The voltage VSGD1 is a voltage that turns on the select transistor ST1. The voltage VSGD1 is higher than the voltage VSS. The row decoder module 15 applies a voltage VREAD to each of the word lines WLsel and WLusel. The voltage VREAD is a voltage that turns on the corresponding memory cell transistors MC, regardless of data stored in the memory cell transistors MC. The row decoder module 15 applies a voltage VSGS1 to the select gate line SGS. The voltage VSGS1 is a voltage that turns on the select transistor ST2. The voltage VSGS1 is higher than the voltage VSS. The sense amplifier module 16 applies a voltage VBL1 to each of the bit lines BLprog and BLinh. The voltage VBL1 is higher than the voltage VSS. The source line driver 17 applies a voltage VCS1 to the source line SL. The voltage VCS1 is higher than the voltage VSS and lower than the voltage VBL1.

In the period from time t1 to time t2, the channel voltages of the NAND string NSprog, the NAND string NSinh, and the NAND strings NS in the unselected string unit SU are brought to the voltage VCS1 by the select transistors ST1 and ST2 and memory cell transistors MC in the block BLK are turned on.

At time t2, the row decoder module 15 applies the voltage VSS to the select gate line SGDusel. The select transistors ST1 included in the unselected string unit SU are thereby turned off. The row decoder module 15 applies a verify voltage VFY1 to the word line WLsel. The voltage VFY1 is a voltage for determining whether or not the threshold voltage of the memory cell transistor MC has reached the target level. The voltage VFY1 is higher than the voltage VSS and lower than the voltage VREAD.

In the NAND string NSprog, the memory cell transistor MC coupled to the word line WLsel is turned on or off based on the stored data (threshold voltage) by the voltage VFY1 being applied to the word line WLsel. When the memory cell transistor MC coupled to the word line WLsel is turned on, i.e., when the threshold voltage of the write-target memory cell transistor MC is lower than the target level, a current flows from the bit line BLprog to the source line SL. In this case, the sequencer 13 determines that verification has failed. When the memory cell transistor MC coupled to the word line WLsel is turned off, i.e., when the threshold voltage of the write-target memory cell transistor MC is higher than or equal to the target level, a current scarcely flows from the bit line BLprog to the source line SL. In this case, the sequencer 13 determines that verification has passed.

In the NAND string NSinh, the threshold voltages of the memory cell transistors MC have not been raised by the program operation, the memory cell transistor MC coupled to the word line WLsel is turned on.

(Channel Precharge Operation)

At time t3, the row decoder module 15 applies the voltage VSGD1 to the select gate line SGDusel. The row decoder module 15 applies the voltage VREAD to the word line WLsel. Accordingly, the channel voltages of the NAND string NSprog, the NAND string NSinh, and the NAND strings NS in the unselected string unit SU are brought to the voltage VCS1, the verify operation ends, and the channel precharge operation starts.

At time t4, the row decoder module 15 applies the voltage VSS to each of the select gate lines SGDsel and SGDusel and word lines WLsel and WLusel. The sense amplifier module 16 applies the voltage VSS to the bit line BLprog. The channel precharge operation continues while the voltages of the select gate lines SGDsel and SGDusel are changing from the voltage VSGD1 to the voltage VSS (the select gate lines SGDsel and SGDusel are being discharged) and the voltages of the word lines WLsel and WLusel are changing from the voltage VREAD to the voltage VSS (the word lines WLsel and WLusel are being discharged). When the channel precharge operation is not executed, i.e., when the sequencer 13 determines that the set value of the voltage VPGM does not exceed the reference value (No in S15 in FIG. 4), the row decoder module 15 also applies the voltage VSS to the select gate line SGS. The sense amplifier module 16 also brings each of the bit lines BLprog and BLinh into a floating state. The channel voltages of the NAND string NSprog, the NAND string NSinh, and the NAND strings NS in the unselected string unit SU each drop to an indeterminate voltage due to the coupling between the channel and the word line WLsel and the coupling between the channel and the word line WLusel. Accordingly, the voltages of the bit lines BLprog and BLinh and source line SL each become an indeterminate voltage.

In the period from time t4 to time t5, the row decoder module 15 also applies the voltage VSGS1 to the select gate line SGS. The sense amplifier module 16 also applies a voltage VBL2 to the bit line BLinh. The voltage VBL2 may be at the same level as or higher than the voltage VBL1. The source line driver 17 applies a voltage VCS2 to the source line SL. The voltage VCS2 may be at the same level as or higher than the voltage VCS1.

In the period from time t4 to time t5, the voltages of the select gate line SGDsel and SGDusel, word lines WLsel and WLusel, and bit line BLprog change to the voltage VSS.

Figure 6:
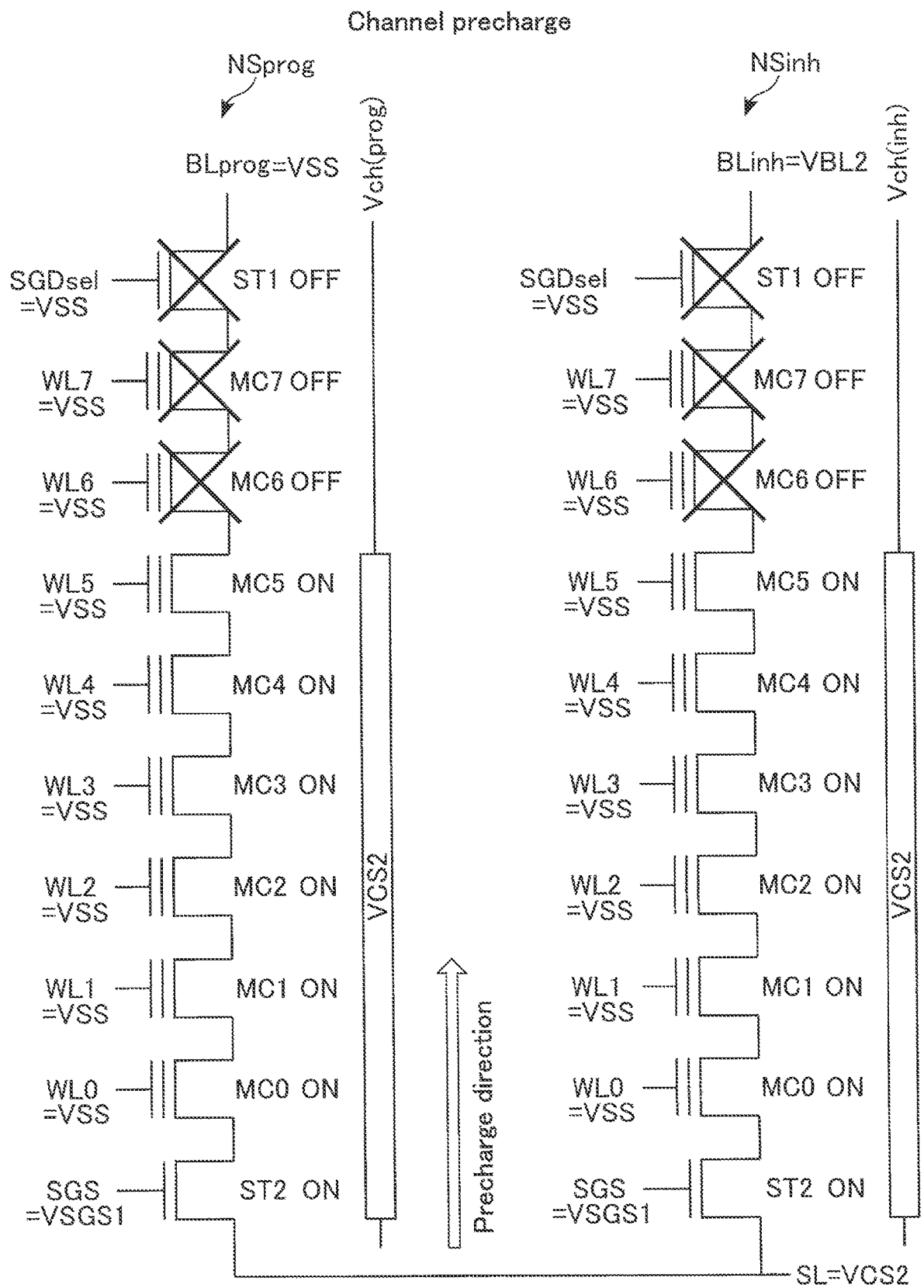
FIG. 6 is a circuit diagram of two NAND strings in the memory cell array included in the semiconductor memory device according to the first embodiment.

Here, the states of NAND strings NS in the channel precharge operation will be described with reference to FIG. 6. FIG. 6 is a circuit diagram of two NAND strings NS in the memory cell array 10 included in the semiconductor memory device 1 according to the present embodiment. FIG. 6 shows a NAND string NSprog and a NAND string NSinh, as an example.

As shown in FIG. 6, in the NAND string NSprog, the select transistor ST1 is turned off by the voltage VSS being applied to the select gate line SGDsel. The select transistor ST2 is turned on by the voltage VSGS1 being applied to the select gate line SGS. The non-programmed memory cell transistors MC0 to MC5 are turned on and the programmed memory cell transistors MC6 and MC7 are turned off by the voltage VSS being applied to the word lines WLsel and WLusel. As a result, in the NAND string NSprog, the voltage VCS2 is applied from the source line SL to the channels of the select transistor ST2 and memory cell transistors MC0 to MC5. Accordingly, the channel voltage Vch(prog) is precharged to the voltage VCS2.

As in the NAND string NSprog, in the NAND string NSinh, the select transistor ST1 and the programmed memory cell transistors MC6 and MC7 are turned off and the select transistor ST2 and the non-programmed memory cell transistors MC0 to MC5 are turned on. Therefore, in the NAND string NSinh, the voltage VCS2 is applied from the source line SL to the channels of the select transistor ST2 and memory cell transistors MC0 to MC5. Accordingly, the channel voltage Vch(inh) is precharged to the voltage VCS2.

In each NAND string NS in the unselected string unit SU, the select transistor ST1 is turned off by the voltage VSS being applied to the select gate line SGDusel. The select transistor ST2 is turned on. Therefore, the channel voltage of each NAND string NS in the unselected string unit SU is also precharged to the voltage VCS2.

The channel precharge operation is not limited to the one in which only the channels of the select transistor ST2 and the non-programmed memory cell transistors MC are precharged. For example, the channels of the programmed ("0"-programmed or "1"-programmed) memory cell transistors MC may also be precharged by controlling the voltages of the word lines WLsel and WLusel. Alternatively, all of the channels of the select transistor ST2, the memory cell transistors MC, and the select transistor ST1 may be precharged by controlling the voltages of the select gate lines SGDsel and SGDusel, and word lines WLsel and WLusel.

At time t5 in FIG. 5, the row decoder module 15 applies the voltage VSS to the select gate line SGS. The channels of the NAND string NSprog, the NAND string NSinh, and the NAND strings NS in the unselected string unit SU are brought into the floating state by the select transistor ST2 being turned off, and the channel precharge operation ends. The channel voltages of the NAND string NSprog, the NAND string NSinh, and the NAND strings NS in the unselected string unit SU are maintained at the voltage VCS2.

The period from time t5 to time t6 corresponds to the precharge recovery operation. The channels of the NAND string NSprog, the NAND string NSinh, and the NAND strings NS in the unselected string unit SU are maintained in the floating state by the select transistors ST1 and ST2 being turned off. Accordingly, the channel voltages of the NAND string NSprog, the NAND string NSinh, and the NAND strings NS in the unselected string unit SU are maintained at the voltage VCS2.

(Program Operation)

At time t6, the row decoder module 15 applies a voltage VSGD2 to the select gate line SGDsel. The voltage VSGD2 is a voltage that turns on the select transistor ST1 included in the NAND string NSprog, and turns off the select transistor ST1 included in the NAND string NSinh. The row decoder module 15 applies the voltage VSS to the select gate line SGDusel. By these controls, the select transistor ST1 included in the NAND string unit NSprog is turned on. Also, the select transistor ST1 included in the NAND string NSinh and the select transistors ST1 included in the unselected string unit SU are turned off. The row decoder module 15 applies the program voltage VPGM to the word line WLsel. The row decoder module 15 applies a voltage VPASS to the word line WLusel. The voltage VPASS is a voltage that turns on the corresponding memory cell transistors MC, regardless of stored data (threshold voltage) of the memory cell transistors MC. The voltage VPASS is higher than the voltage VSGD2 and lower than the voltage VPGM. The row decoder module 15 applies the voltage VSS to the select gate line SGS. Accordingly, the select transistors ST2 are turned off. The sense amplifier module 16 applies the voltage VSS to the bit line BLprog. The sense amplifier module 16 applies the voltage VBL2 to the bit line BLinh. The voltage VBL2 is higher than the voltage VSS. The source line driver 17 applies the voltage VCS2 to the source line SL. The voltage VCS2 is higher than the voltage VSS, and firmly turns off the select transistor ST2.

In the NAND string NSprog, the select transistor ST1 is turned on by the voltage VSGD2 being applied to the select gate line SGDsel and the voltage VSS being applied to the bit line BLprog. The select transistor ST2 is turned off. By the voltage VPGM being applied to the word line WLsel in this state, the memory cell transistor MC coupled to the word line WLsel is turned on. The memory cell transistor MC coupled to the word line WLusel is turned on by the voltage VPASS being applied to the word line WLusel. As a result, the channel of the NAND string NSprog is electrically coupled to the bit line BLprog. Accordingly, the channel voltage Vch(prog) is brought to the voltage VSS. In the NAND string NSprog, electrons are injected from the channel to the charge storage layer of the memory cell transistor MC coupled to the word line WLsel based on the voltage difference between the channel and the word line WLsel. Consequently, the threshold voltage of the memory cell transistor MC coupled to the word line WLsel rises.

In the NAND string NSinh, the select transistor ST1 is turned off by the voltage VSGD2 being applied to the select gate line SGDsel and the voltage VBL2 being applied to the bit line BLinh. The channel of the NAND string NSinh is brought into the floating state by the select transistors ST1 and ST2 being turned off. As a result, the channel voltage Vch(inh) rises to a voltage VBT (hereinafter referred to as a "self-boost") due to the coupling between the channel and the word line WLusel. In the NAND string NSinh, the self-boost makes the voltage difference between the channel and the word line WLsel smaller than that in the NAND string NSprog; therefore, the rise in the threshold voltage of the memory cell transistor MC coupled to the word line WLsel is suppressed.

Also, in the unselected string unit SU, the select transistors ST1 and ST2 are turned off. Therefore, the rise in the threshold voltages of the memory cell transistors MC coupled to the word line WLsel is suppressed by a self-boost, as in the NAND string NSinh.

At time t8, the row decoder module 15 applies the voltage VSS to each of the select gate line SGDsel and word lines WLsel and WLusel. The sense amplifier module 16 applies the voltage VSS to the bit line BLinh. The source line driver 17 applies the voltage VSS to the source line SL. This is the end of the program operation.

The period from time t8 to time t9 corresponds to the program recovery operation. The channel voltages of the NAND string NSprog, the NAND string NSinh, and the NAND strings NS in the unselected string unit SU are brought to the voltage VSS by the select transistors ST1 and ST2 and memory cell transistors MC0 to MC7 being turned off.

[1-3] Advantageous Effects

According to the present embodiment, a channel precharge operation is executed consecutively after a verify operation in the i-th program loop. In the channel precharge operation, with the select transistor ST2 turned on, the voltage of the select gate line SGDsel is changed from the voltage VSGD1, which is applied in the verify operation, to the voltage VSS. The voltage of the select gate line SGDusel is first changed from the voltage VSS, which is applied in the verify operation, to the voltage VSGD1, and then changed from the voltage VSGD1 to the voltage VSS. The voltage of the word line WLsel is first changed from the voltage VFY1, which is applied in the verify operation, to the voltage VREAD, and then changed from the voltage VREAD to the voltage VSS. The voltage of the word line WLusel is changed from the voltage VREAD, which is applied in the verify operation, to the voltage VSS. After the voltages of the select gate line SGDsel and SGDusel and word lines WLsel and WLusel are changed to the voltage VSS, the voltage of the select gate line SGS is changed from the voltage VSGS1, which is applied in the verify operation, to the voltage VSS. By these controls, the channel voltage Vch(inh) is precharged to the voltage of the source line SL. Namely, the channel voltage Vch(inh) can be precharged while the voltages of the select gate lines SGDsel and SGDusel and word lines WLsel and WLusel are being changed from the voltages applied in the verify operation to the voltage VSS. This enables reduction in the time required for execution of a write operation and speedup of the operation of the semiconductor memory device 1.

In the case where the voltages of the word lines WLsel and WLusel are changed to the voltage VSS after the channel voltage Vch(inh) has been precharged, the precharged channel voltage Vch(inh) may decrease due to the influence of the change to the voltage VSS. However, according to the present embodiment, precharging of the channel voltage Vch(inh) ends after the voltages of the word lines WLsel and WLusel have changed to the voltage VSS. Therefore, the voltages of the word lines WLsel and WLusel need not be changed to the voltage VSS after the channel voltage Vch(inh) has been precharged. Accordingly, a decrease in the precharged channel voltage Vch(inh) can be suppressed, and the boost efficiency (precharged channel voltage Vch(inh)/voltage VPASS of word line WLusel) can be improved.

[2] Second Embodiment

The second embodiment will be described. The configuration of the semiconductor memory device 1 according to the present embodiment is the same as that in the first embodiment. The flow of a write operation is the same as that in the first embodiment shown in FIG. 4. The semiconductor memory device 1 according to the present embodiment differs from that in the first embodiment in that, in the channel precharge operation, the voltage of the select gate line SGS is changed from the voltage VSGS1, which is applied in the verify operation, to the voltage VSS in two steps. Hereinafter, the points different from the first embodiment will be mainly described.

[2-1] Voltages of Various Interconnects, Etc. in Write Operation

Figure 7:
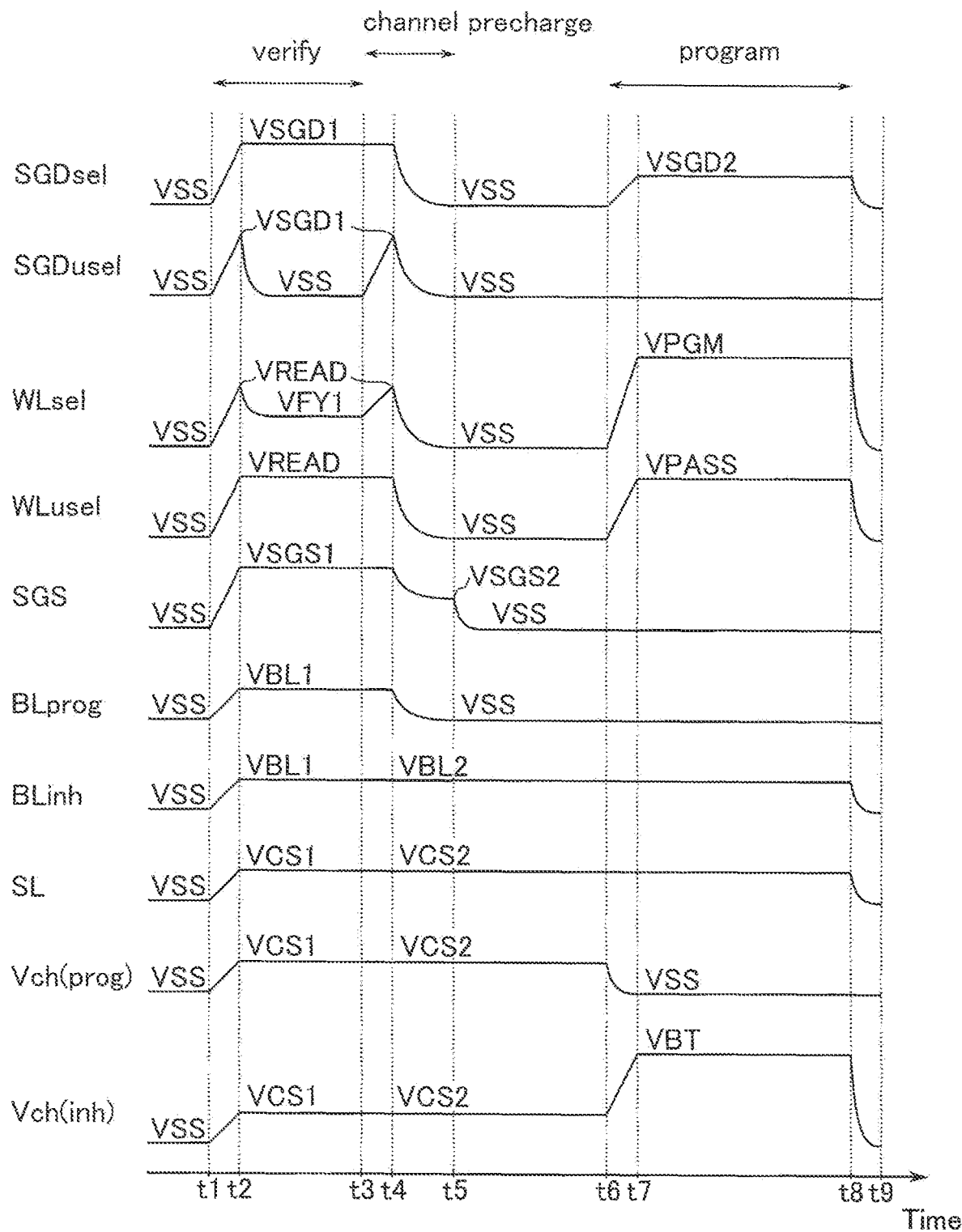
FIG. 7 is a timing chart showing voltages of various interconnects, etc. in a write operation of a semiconductor memory device according to a second embodiment.

Voltages of various interconnects, etc. in a write operation will be described with reference to FIG. 7. FIG. 7 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the source line SL in a state where the memory cell transistors MC6 and MC7 have been programmed and the memory cell transistors MC0 to MC5 have not been programmed. Hereinafter, the case where the threshold voltages of the memory cell transistors MC6 and MC7 are positive voltages will be described to simplify the description.

In the i-th program loop, after a program operation is executed, the voltages of various interconnects, etc. are controlled so that a verify operation is executed, as in the period from time t1 to time t3 in the first embodiment shown in FIG. 5. After the verify operation is executed, a channel precharge operation is executed. Control of the voltages of various interconnects, etc. in the channel precharge operation is performed as follows.

(Channel Precharge Operation)

In the period from time t3 to time t4, the voltages of various interconnects are similar to those in the first embodiment. In the period from time t4 to time t5, the row decoder module 15 applies a voltage VSGS2 to the select gate line SGS. The voltage VSGS2 is a voltage that turns on the select transistor ST2. The voltage VSGS2 is higher than the voltage VSS and lower than the voltage VSGS1. The voltage VSGS2 may be at the same level as or higher than the voltage VSGS1. The voltages of the other interconnects are similar to those in the first embodiment.

In the period from time t4 to time t5, the voltages of the select gate line SGDsel and SGDusel, word lines WLsel and WLusel, and bit line BLprog change to the voltage VSS. The voltage of the select gate line SGS changes to the voltage VSGS2.

In the NAND string NSprog, the select transistor ST1 is turned off by the voltage VSS being applied to the select gate line SGDsel. The select transistor ST2 is turned on by the voltage VSGS2 being applied to the select gate line SGS. The non-programmed memory cell transistors MC0 to MC5 are turned on and the programmed memory cell transistors MC6 and MC7 are turned off by the voltage VSS being applied to the word lines WLsel and WLusel. As a result, in the NAND string NSprog, the voltage VCS2 is applied from the source line SL to the channels of the select transistor ST2 and memory cell transistors MC0 to MC5. Accordingly, the channel voltage Vch(prog) is precharged to the voltage VCS2.

As in the NAND string NSprog, in the NAND string NSinh, the select transistor ST1 and the programmed memory cell transistors MC6 and MC7 are turned off and the select transistor ST2 and the non-programmed memory cell transistors MC0 to MC5 are turned on. Therefore, in the NAND string NSinh, the voltage VCS2 is applied from the source line SL to the channels of the select transistor ST2 and memory cell transistors MC0 to MC5. Accordingly, the channel voltage Vch(inh) is precharged to the voltage VCS2.

In each NAND string NS in the unselected string unit SU, the select transistor ST1 is turned off by the voltage VSS being applied to the select gate line SGDusel. The select transistor ST2 is turned on. Therefore, the channel voltage of each NAND string NS in the unselected string unit SU is also precharged to the voltage VCS2.

After the channel precharge operation is executed, in the period from time t5 to time t9, the voltages of various interconnects, etc. are controlled so that the channel precharge recovery operation, the program operation, and the program recovery operation are executed, as in the period from time t5 to time t9 in the first embodiment shown in FIG. 5.

[2-2] Advantageous Effects

The present embodiment has advantageous effects similar to those described in the first embodiment. According to the present embodiment, in the channel precharge operation, the voltage VSS is applied to the select gate lines SGDsel and SGDusel and word lines WLsel and WLusel, during which the voltage of the select gate line SGS is started to be changed from the voltage VSGS1, which is applied in the verify operation, to the voltage VSGS2. Therefore, when the voltage VSGS2 is lower than the voltage VSGS1, the select gate line SGS is discharged. In this case, the speed at which the voltage of the select gate line SGS changes from the voltage VSGS2 to the voltage VSS can be increased. When the voltage VSGS2 is higher than the voltage VSGS1, the select gate line SGS is charged. In this case, charging of the channel can be intensified.

[3] Third Embodiment

The third embodiment will be described. The configuration of the semiconductor memory device 1 according to the present embodiment is the same as that in the first embodiment. The flow of a write operation is the same as that in the first embodiment shown in FIG. 4. The semiconductor memory device 1 according to the present embodiment differs from that in the first embodiment in that, in the channel precharge operation, the voltages of the word lines WLsel and WLusel are each changed to a voltage higher than the voltage VSS. Hereinafter, the points different from the first embodiment will be mainly described.

[3-1] Voltages of Various Interconnects, Etc. in Write Operation

Figure 8:
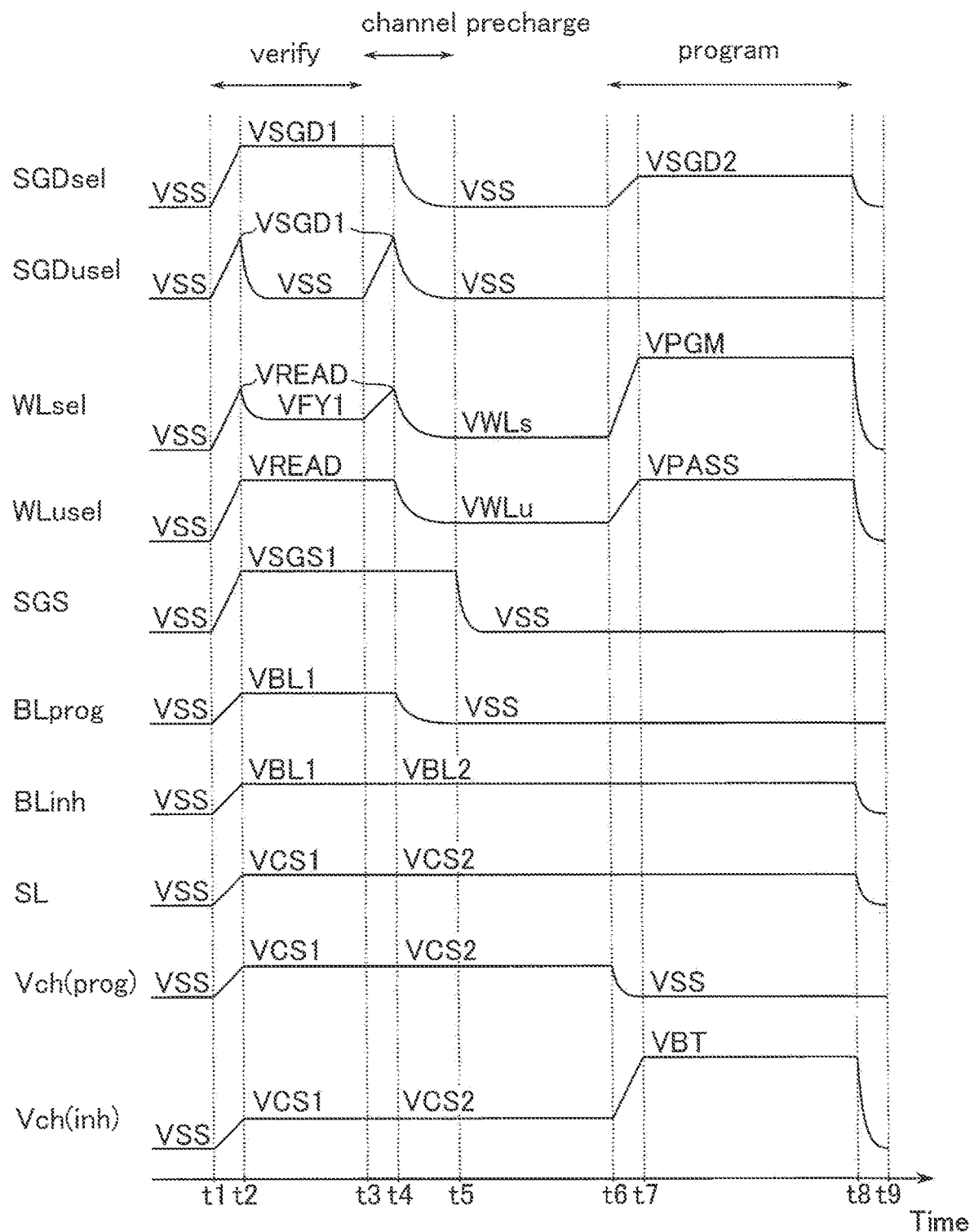
FIG. 8 is a timing chart showing voltages of various interconnects, etc. in a write operation of a semiconductor memory device according to a third embodiment.

Voltages of various interconnects, etc. in a write operation will be described with reference to FIG. 8. FIG. 8 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the source line SL in a state where the memory cell transistors MC6 and MC7 have been programmed and the memory cell transistors MC0 to MC5 have not been programmed. Hereinafter, the case where the threshold voltages of the memory cell transistors MC6 and MC7 are positive voltages will be described to simplify the description.

In the i-th program loop, after a program operation is executed, the voltages of various interconnects, etc. are controlled so that a verify operation is executed, as in the period from time t1 to time t3 in the first embodiment shown in FIG. 5. After the verify operation is executed, a channel precharge operation is executed. Control of the voltages of various interconnects, etc. in the channel precharge operation is performed as follows.

(Channel Precharge Operation)

In the period from time t3 to time t4, the voltages of various interconnects are similar to those in the first embodiment. In the period from time t4 to time t5, the row decoder module 15 applies a voltage VWLs to the word line WLsel. The row decoder module 15 applies a voltage VWLu to the word line WLusel. Each of the voltages VWLs and VWLu is a voltage that turns on programmed memory cell transistors MC and turns off non-programmed memory cell transistors MC. The voltages VWLs and VWLu are higher than the voltage VSS. The voltage VWLu may be at the same level as or a different level from the voltage VWLs. The voltages of the other interconnects are similar to those in the first embodiment.

In the period from time t4 to time t5, the voltages of the select gate lines SGDsel and SGDusel and bit line BLprog change to the voltage VSS. The voltage of the word line WLsel changes to the voltage VWLs. The voltage of the word line WLusel changes to the voltage VWLu.

In the NAND string NSprog, the select transistor ST1 is turned off by the voltage VSS being applied to the select gate line SGDsel. The select transistor ST2 is turned on by the voltage VSGS1 being applied to the select gate line SGS. The non-programmed memory cell transistors MC0 to MC5 are turned on and the programmed memory cell transistors MC6 and MC7 are turned off by the voltage VWLs being applied to the word line WLsel and the voltage VWLu being applied to the word line WLusel. As a result, in the NAND string NSprog, the voltage VCS2 is applied from the source line SL to the channels of the select transistor ST2 and memory cell transistors MC0 to MC5. Accordingly, the channel voltage Vch(prog) is precharged to the voltage VCS2.

As in the NAND string NSprog, in the NAND string NSinh, the select transistor ST1 and the programmed memory cell transistors MC6 and MC7 are turned off and the select transistor ST2 and the non-programmed memory cell transistors MC0 to MC5 are turned on. Therefore, in the NAND string NSinh, the voltage VCS2 is applied from the source line SL to the channels of the select transistor ST2 and memory cell transistors MC0 to MC5. Accordingly, the channel voltage Vch(inh) is precharged to the voltage VCS2.

In each NAND string NS in the unselected string unit SU, the select transistor ST1 is turned off by the voltage VSS being applied to the select gate line SGDusel. The select transistor ST2 is turned on. Therefore, the channel voltage of each NAND string NS in the unselected string unit SU is also precharged to the voltage VCS2.

After the channel precharge operation is executed, in the period from time t5 to time t9, the voltages of various interconnects, etc. are controlled so that the channel precharge recovery operation, the program operation, and the program recovery operation are executed, as in the period from time t5 to time t9 in the first embodiment shown in FIG. 5.

[3-2] Advantageous Effects

The present embodiment has advantageous effects similar to those described in the first embodiment. According to the present embodiment, in the channel precharge operation, with the select transistor ST2 turned on, the voltage of the select gate line SGDsel is changed from the voltage VSGD1, which is applied in the verify operation, to the voltage VSS. The voltage of the select gate line SGDusel is first changed from the voltage VSS, which is applied in the verify operation, to the voltage VSGD1, and then changed from the voltage VSGD1 to the voltage VSS. The voltage of the word line WLsel is first changed from the voltage VFY1, which is applied in the verify operation, to the voltage VREAD, and then changed from the voltage VREAD to the voltage VWLs (>voltage VSS). The voltage of the word line WLusel is changed from the voltage VREAD, which is applied in the verify operation, to the voltage VWLu (>voltage VSS). The changed voltages of the word lines WLsel and WLusel are higher than the voltage VSS. Therefore, the speed at which the channel of the NAND string NS is charged can be increased. In addition, the voltages of the word lines WLsel and WLusel need not be changed to the voltage VSS. Therefore, the times required for charging/discharging of the word lines WLsel and WLusel can be reduced. Moreover, the boost times to the voltage VPASS and voltage VPGM in the next program operation can be reduced.

The semiconductor memory device 1 according to the present embodiment can also be applied to the second embodiment, as a matter of course.

[4] Fourth Embodiment

The fourth embodiment will be described. The configuration of the semiconductor memory device 1 according to the present embodiment is the same as that in the first embodiment. The flow of a write operation is the same as that in the first embodiment shown in FIG. 4. The semiconductor memory device 1 according to the present embodiment differs from that in the first embodiment in that, in the channel precharge operation, the voltage of the source line SL is raised from the voltage VCS1 to the voltage VCS2. Hereinafter, the points different from the first embodiment will be mainly described.

[4-1] Voltages of Various Interconnects, Etc. in Write Operation

Figure 9:
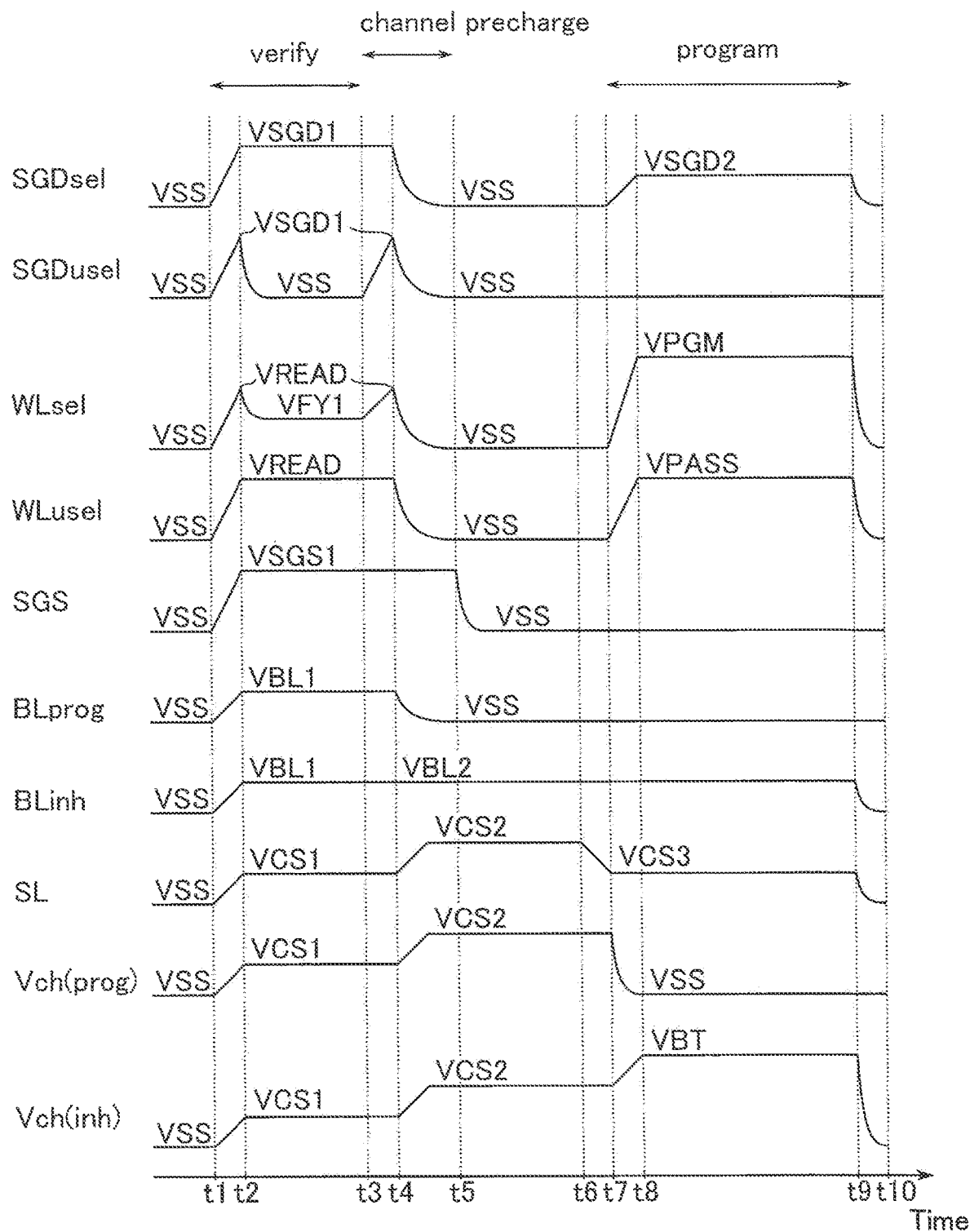
FIG. 9 is a timing chart showing voltages of various interconnects, etc. in a write operation of a semiconductor memory device according to a fourth embodiment.

Voltages of various interconnects, etc. in a write operation will be described with reference to FIG. 9. FIG. 9 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the source line SL in a state where the memory cell transistors MC6 and MC7 have been programmed and the memory cell transistors MC0 to MC5 have not been programmed. Hereinafter, the case where the threshold voltages of the memory cell transistors MC6 and MC7 are positive voltages will be described to simplify the description.

In the i-th program loop, after a program operation is executed, the voltages of various interconnects, etc. are controlled so that a verify operation is executed, as in the period from time t1 to time t3 in the first embodiment shown in FIG. 5. After the verify operation is executed, a channel precharge operation is executed. Control of the voltages of various interconnects, etc. in the channel precharge operation is performed as follows.

(Channel Precharge Operation)

In the period from time t3 to time t4, the voltages of various interconnects are similar to those in the first embodiment. In the period from time t4 to time t5, the source line driver 17 applies the voltage VCS2 to the source line SL. In the present embodiment, the voltage VCS2 is higher than the voltage VCS1. The voltages of the other interconnects are similar to those in the first embodiment.

In the period from time t4 to time t5, the voltages of the select gate line SGDsel and SGDusel, word lines WLsel and WLusel, and bit line BLprog change to the voltage VSS.

In the NAND string NSprog, the select transistor ST1 is turned off by the voltage VSS being applied to the select gate line SGDsel. The select transistor ST2 is turned on by the voltage VSGS1 being applied to the select gate line SGS. The non-programmed memory cell transistors MC0 to MC5 are turned on and the programmed memory cell transistors MC6 and MC7 are turned off by the voltage VSS being applied to the word lines WLsel and WLusel. As a result, in the NAND string NSprog, the voltage VCS2 is applied from the source line SL to the channels of the select transistor ST2 and memory cell transistors MC0 to MC5. Accordingly, the channel voltage Vch(prog) is precharged to the voltage VCS2.

As in the NAND string NSprog, in the NAND string NSinh, the select transistor ST1 and the programmed memory cell transistors MC6 and MC7 are turned off and the select transistor ST2 and the non-programmed memory cell transistors MC0 to MC5 are turned on. Therefore, in the NAND string NSinh, the voltage VCS2 is applied from the source line SL to the channels of the select transistor ST2 and memory cell transistors MC0 to MC5. Accordingly, the channel voltage Vch(inh) is precharged to the voltage VCS2.

In each NAND string NS in the unselected string unit SU, the select transistor ST1 is turned off by the voltage VSS being applied to the select gate line SGDusel. The select transistor ST2 is turned on. Therefore, the channel voltage of each NAND string NS in the unselected string unit SU is also precharged to the voltage VCS2.

At time t5, the row decoder module 15 applies the voltage VSS to the select gate line SGS. The channels of the NAND string NSprog, the NAND string NSinh, and the NAND strings NS in the unselected string unit SU are brought into the floating state by the select transistor ST2 being turned off, and the channel precharge operation ends. The channel voltages of the NAND string NSprog, the NAND string NSinh, and the NAND strings NS in the unselected string unit SU are maintained at the voltage VCS2.

The period from time t5 to time t7 corresponds to the precharge recovery operation. At time t6, the source line driver 17 applies a voltage VCS3 to the source line SL. The voltage VCS3 is higher than the voltage VSS and lower than the voltage VCS2. The channels of the NAND string NSprog, the NAND string NSinh, and the NAND strings NS in the unselected string unit SU are maintained in the floating state by the select transistor ST2 being turned off. Accordingly, the channel voltages of the NAND string NSprog, the NAND string NSinh, and the NAND strings NS in the unselected string unit SU are maintained at the voltage VCS2.

After the precharge recovery operation is executed, in the (i+1)-th program loop, the voltages of various interconnects, etc. are controlled so that the program operation and the program recovery operation are executed in the period from time t7 to time t10, as in the period from time t6 to time t9 in the first embodiment shown in FIG. 5.

[4-2] Advantageous Effects

The present embodiment has advantageous effects similar to those described in the first embodiment. According to the present embodiment, in the channel precharge operation, with the select transistor ST2 turned on, the voltage VSS is applied to each of the select gate lines SGDsel and SGDusel and word lines WLsel and WLusel, during which the voltage of the source line SL is raised from the voltage VCS1 to the voltage VCS2. Therefore, the voltage with which the channel of each NAND string NS is precharged can be adjusted.

The semiconductor memory device 1 according to the present embodiment can also be applied to the second embodiment and the third embodiment, as a matter of course.

[5] Fifth Embodiment

The fifth embodiment will be described. The configuration of the semiconductor memory device 1 according to the present embodiment is the same as that in the first embodiment. The semiconductor memory device 1 according to the present embodiment sequentially executes write operations on the memory cell transistors MC in each NAND string NS from the select transistor ST2 side to the select transistor ST1 side. In other words, the semiconductor memory device 1 according to the present embodiment sequentially executes write operations on cell units CU in each string unit SU from the source line SL side. Also, the semiconductor memory device 1 according to the present embodiment precharges the channel in each NAND string NS with a voltage from the bit line BL. Hereinafter, the points different from the first embodiment will be mainly described.

[5-1] Overview of Write Operation

An overview of a write operation will be described. The flow of a write operation is the same as that in the first embodiment shown in FIG. 4.

[5-2] Voltages of Various Interconnects, Etc. in Write Operation

Figure 10:
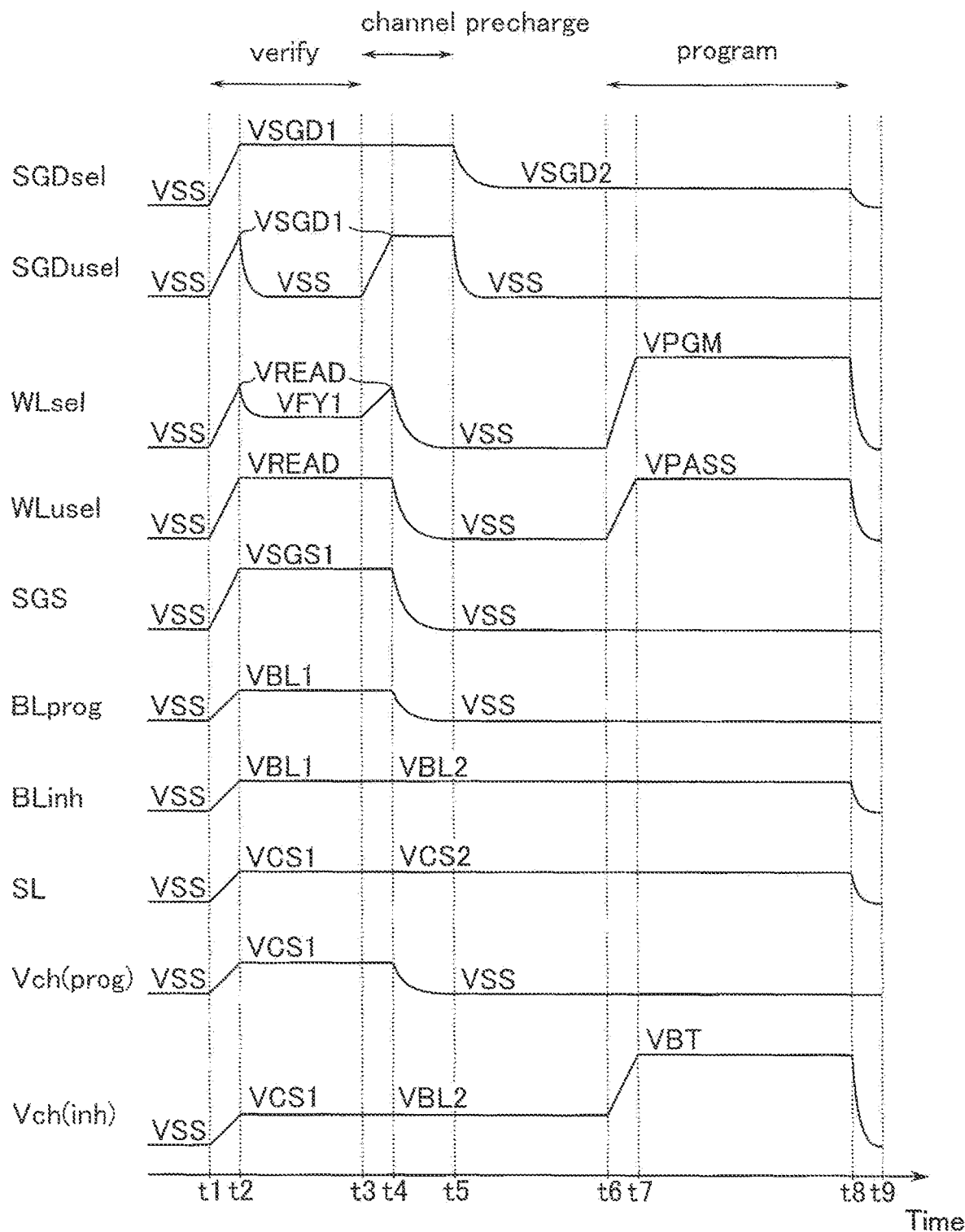
FIG. 10 is a timing chart showing voltages of various interconnects, etc. in a write operation of a semiconductor memory device according to a fifth embodiment.

Voltages of various interconnects, etc. in a write operation will be described with reference to FIG. 10. FIG. 10 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the bit line BL in a state where the memory cell transistors MC0 and MC1 have been programmed and the memory cell transistors MC2 to MC7 have not been programmed. Hereinafter, the case where the threshold voltages of the memory cell transistors MC0 and MC1 are positive voltages will be described to simplify the description.

In the i-th program loop, after a program operation is executed, the voltages of various interconnects, etc. are controlled so that a verify operation is executed, as in the period from time t1 to time t3 in the first embodiment shown in FIG. 5. After the verify operation is executed, a channel precharge operation is executed. Control of the voltages of various interconnects, etc. in the channel precharge operation is performed as follows.

(Channel Precharge Operation)

In the period from time t3 to time t4, the voltages of various interconnects are similar to those in the first embodiment. In the period from time t4 to time t5, the row decoder module 15 applies the voltage VSGD1 to the select gate lines SGDsel and SGDusel. The row decoder module 15 also applies the voltage VSS to the select gate line SGS. The voltages of the other interconnects are similar to those in the first embodiment.

In the period from time t4 to time t5, the voltages of the word lines WLwel and WLusel, select gate line SGS, and bit line BLprog change to the voltage VSS.

Figure 11:
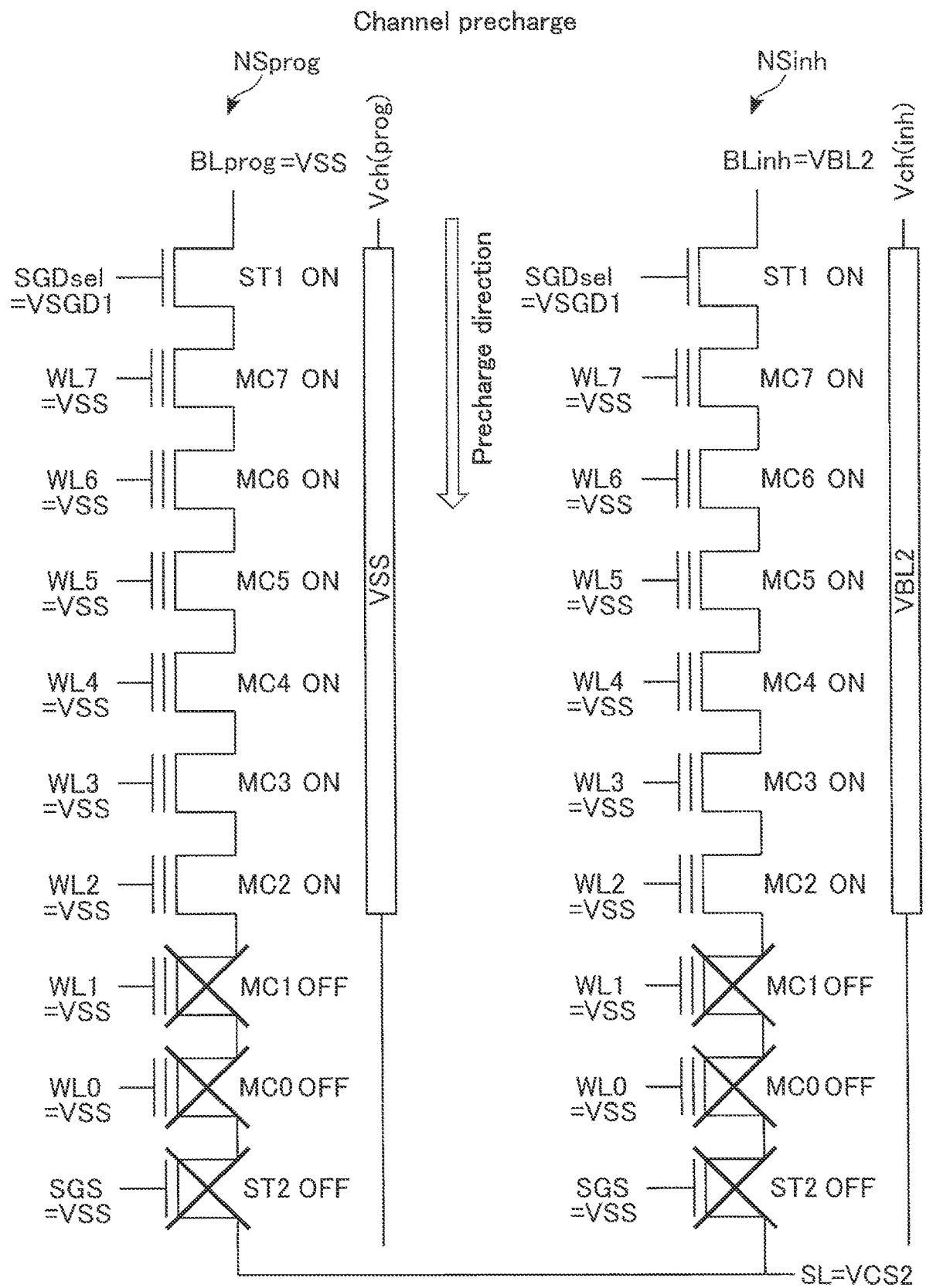
FIG. 11 is a circuit diagram of two NAND strings in a memory cell array included in the semiconductor memory device according to the fifth embodiment.

Here, the states of NAND strings NS in the channel precharge operation will be described with reference to FIG. 11. FIG. 11 is a circuit diagram of two NAND strings NS in the memory cell array 10 included in the semiconductor memory device 1 according to the present embodiment. FIG. 11 shows a NAND string NSprog and a NAND string NSinh, as an example.

As shown in FIG. 11, in the NAND string NSprog, the select transistor ST1 is turned on by the voltage VSGD1 being applied to the select gate line SGDsel. The select transistor ST2 is turned off by the voltage VSS being applied to the select gate line SGS. The non-programmed memory cell transistors MC2 to MC7 are turned on and the programmed memory cell transistors MC0 and MC1 are turned off by the voltage VSS being applied to the word lines WLsel and WLusel. As a result, in the NAND string NSprog, the voltage VSS is applied from the bit line BLprog to the channels of the select transistor ST1 and memory cell transistors MC2 to MC7. Accordingly, the channel voltage Vch(prog) is precharged to the voltage VSS.

As in the NAND string NSprog, in the NAND string NSinh, the select transistor ST2 and the programmed memory cell transistors MC0 and MC1 are turned off and the select transistor ST1 and the non-programmed memory cell transistors MC2 to MC7 are turned on. Therefore, in the NAND string NSinh, the voltage VBL2 is applied from the bit line BLinh to the channels of the select transistor ST1 and memory cell transistors MC2 to MC7. Accordingly, the channel voltage Vch(inh) is precharged to the voltage VBL2.

In each NAND string NS in the unselected string unit SU, the select transistor ST2 is turned off by the voltage VSS being applied to the select gate line SGS. The select transistor ST1 is turned on. Therefore, the channel voltage of the NAND string NS coupled to the bit line BLprog in the unselected string unit SU is also precharged to the voltage VSS. The channel voltage of the NAND string NS coupled to the bit line BLinh in the unselected string unit SU is also precharged to the voltage VBL2.

The channel precharge operation is not limited to the one in which only the channels of the select transistor ST1 and the non-programmed memory cell transistors MC are precharged. For example, the channels of the programmed ("0"-programmed or "i"-programmed) memory cell transistors MC may also be precharged by controlling the voltages of the word lines WLsel and WLusel. Alternatively, all of the channels of the select transistor ST1, the memory cell transistors MC, and the select transistor ST2 may be precharged by controlling the voltages of the select gate line SGS and word lines WLsel and WLusel.

At time t5 in FIG. 10, the row decoder module 15 applies the voltage VSGD2 to the select gate line SGDsel. The row decoder module 15 applies the voltage VSS to the select gate line SGDusel. The channels of the NAND string NSinh and the NAND strings NS in the unselected string unit SU are brought into the floating state by the select transistor ST1 included in the NAND string NSinh, the select transistors ST1 included in the unselected string unit SU, and the select transistors ST2 being turned off, and the channel precharge operation ends. The channel voltages of the NAND string NSprog and the NAND string NS coupled to the bit line BLprog in the unselected string unit SU are maintained at the voltage VSS. The channel voltages of the NAND string NSinh and the NAND string NS coupled to the bit line BLinh in the unselected string unit SU are maintained at the voltage VBL2.

The period from time t5 to time t6 corresponds to the precharge recovery operation. The channels of the NAND string NSinh and the NAND strings NS in the unselected string unit SU are maintained in the floating state by the select transistor ST1 included in the NAND string NSinh, the select transistors ST1 included in the unselected string unit SU, and the select transistors ST2 being turned off. Accordingly, the channel voltages of the NAND string NSprog and the NAND string NS coupled to the bit line BLprog in the unselected string unit SU are maintained at the voltage VSS. The channel voltages of the NAND string NSinh and the NAND string NS coupled to the bit line BLinh in the unselected string unit SU are maintained at the voltage VBL2.

After the precharge recovery operation is executed, in the (i+1)-th program loop, the voltages of various interconnects, etc. are controlled so that the program operation and the program recovery operation are executed in the period from time t6 to time t9, as in the period from time t6 to time t9 in the first embodiment shown in FIG. 5.

[5-3] Advantageous Effects

According to the present embodiment, a channel precharge operation is executed consecutively after a verify operation in the i-th program loop. In the channel precharge operation, with the select transistor ST1 turned on, the voltage of the word line WLsel is changed from the voltage VFY1, which is applied in the verify operation, to the voltage VREAD, and then changed from the VREAD to the voltage VSS. The voltage of the word line WLusel is changed from the voltage VREAD, which is applied in the verify operation, to the voltage VSS. In addition, the voltage of the select gate line SGS is changed from the voltage VSGS1, which is applied in the verify operation, to the voltage VSS. After the voltages of the word lines WLsel and WLusel and select gate line SGS are changed to the voltage VSS, the voltage of the select gate line SGDsel is changed from the voltage VSGD1, which is applied in the verify operation, to the voltage VSGD2, and the voltage of the select gate line SGDusel is changed from the voltage VSGD1 to the voltage VSS. By these controls, the channel voltage Vch(inh) is precharged to the voltage of the bit line BLinh. Namely, the channel voltage Vch(inh) can be precharged while the voltages of the word lines WLsel and WLusel and select gate line SGS are being changed from the voltages applied in the verify operation to the voltage VSS. Also, according to the present embodiment, precharging of the channel voltage Vch(inh) ends after the voltages of the word lines WLsel and WLusel have changed to the voltage VSS. Therefore, the present embodiment has advantageous effects similar to those described in the first embodiment.

[6] Sixth Embodiment

The sixth embodiment will be described. The configuration of the semiconductor memory device 1 according to the present embodiment is the same as that in the fifth embodiment. The flow of a write operation is the same as that in the first embodiment shown in FIG. 4. The semiconductor memory device 1 according to the present embodiment differs from that in the fifth embodiment in that, in the channel precharge operation, the voltage of the select gate line SGDsel is changed from the voltage VSGD1, which is applied in the verify operation, to the voltage VSGD2 in two steps. Hereinafter, the points different from the fifth embodiment will be mainly described.

[6-1] Voltages of Various Interconnects, Etc. in Write Operation

Voltages of various interconnects, etc. in a write operation will be described with reference to FIG. 12. FIG. 12 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the bit line BL in a state where the memory cell transistors MC0 and MC1 have been programmed and the memory cell transistors MC2 to MC7 have not been programmed. Hereinafter, the case where the threshold voltages of the memory cell transistors MC0 and MC1 are positive voltages will be described to simplify the description.

In the i-th program loop, after a program operation is executed, the voltages of various interconnects, etc. are controlled so that a verify operation is executed, as in the period from time t1 to time t3 in the fifth embodiment shown in FIG. 10. After the verify operation is executed, a channel precharge operation is executed. Control of the voltages of various interconnects, etc. in the channel precharge operation is performed as follows.

(Channel Precharge Operation)

In the period from time t3 to time t4, the voltages of various interconnects are similar to those in the fifth embodiment. In the period from time t4 to time t5, the row decoder module 15 applies a voltage VSGD3 to the select gate line SGDsel. The voltage VSGD3 is a voltage that turns on the select transistor ST1. The voltage VSGD3 is higher than the voltage VSGD2 and lower than the voltage VSGD1. The voltage VSGD3 may be at the same level as or higher than the voltage VSGD1. The voltages of the other interconnects are similar to those in the fifth embodiment.

In the period from time t4 to time t5, the voltage of the select gate line SGDsel changes to the voltage VSGD3. The voltages of the word lines WLsel and WLusel, select gate line SGS, and bit line BLprog change to the voltage VSS.

In the NAND string NSprog, the select transistor ST1 is turned on by the voltage VSGD3 being applied to the select gate line SGDsel. The select transistor ST2 is turned off by the voltage VSS being applied to the select gate line SGS. The non-programmed memory cell transistors MC2 to MC7 are turned on and the programmed memory cell transistors MC0 and MC1 are turned off by the voltage VSS being applied to the word lines WLsel and WLusel. As a result, in the NAND string NSprog, the voltage VSS is applied from the bit line BLprog to the channels of the select transistor ST1 and memory cell transistors MC2 to MC7. Accordingly, the channel voltage Vch(prog) is precharged to the voltage VSS.

As in the NAND string NSprog, in the NAND string NSinh, the select transistor ST2 and the programmed memory cell transistors MC0 and MC1 are turned off and the select transistor ST1 and the non-programmed memory cell transistors MC2 to MC7 are turned on. Therefore, in the NAND string NSinh, the voltage VBL2 is applied from the bit line BLinh to the channels of the select transistor ST1 and memory cell transistors MC2 to MC7. Accordingly, the channel voltage Vch(inh) is precharged to the voltage VBL2.

In each NAND string NS in the unselected string unit SU, the select transistor ST2 is turned off by the voltage VSS being applied to the select gate line SGS. The select transistor ST1 is turned on. Therefore, the channel voltage of the NAND string NS coupled to the bit line BLprog in the unselected string unit SU is also precharged to the voltage VSS. The channel voltage of the NAND string NS coupled to the bit line BLinh in the unselected string unit SU is also precharged to the voltage VBL2.

After the channel precharge operation is executed, the voltages of various interconnects, etc. are controlled so that the channel precharge recovery operation, the program operation, and the program recovery operation are executed in the period from time t5 to time t9, as in the period from time t5 to time t9 in the fifth embodiment shown in FIG. 10.

[6-2] Advantageous Effects

The present embodiment has advantageous effects similar to those described in the fifth embodiment. According to the present embodiment, in the channel precharge operation, the voltage VSS is applied to the word lines WLsel and WLusel and the select gate line SGS, during which the voltage of the select gate line SGDsel is started to be changed from the voltage VSGD1, which is applied in the verify operation, to the voltage VSGD3. Therefore, when the voltage VSGD3 is lower than the voltage VSGD1, the select gate line SGDsel is discharged. In this case, the speed at which the voltage of the select gate line SGDsel changes to the voltage VSGD2 can be increased. When the voltage VSGD3 is higher than the voltage VSGD1, the select gate line SGDsel is charged. In this case, charging of the channel can be intensified.

[7] Seventh Embodiment

The seventh embodiment will be described. The configuration of the semiconductor memory device 1 according to the present embodiment is the same as that in the fifth embodiment. The flow of a write operation is the same as that in the first embodiment shown in FIG. 4. The semiconductor memory device 1 according to the present embodiment differs from that in the fifth embodiment in that, in the channel precharge operation, the voltages of the word lines WLsel and WLusel are each changed to a voltage higher than the voltage VSS. Hereinafter, the points different from the fifth embodiment will be mainly described.

[7-1] Voltages of Various Interconnects, Etc. in Write Operation

Figure 13:
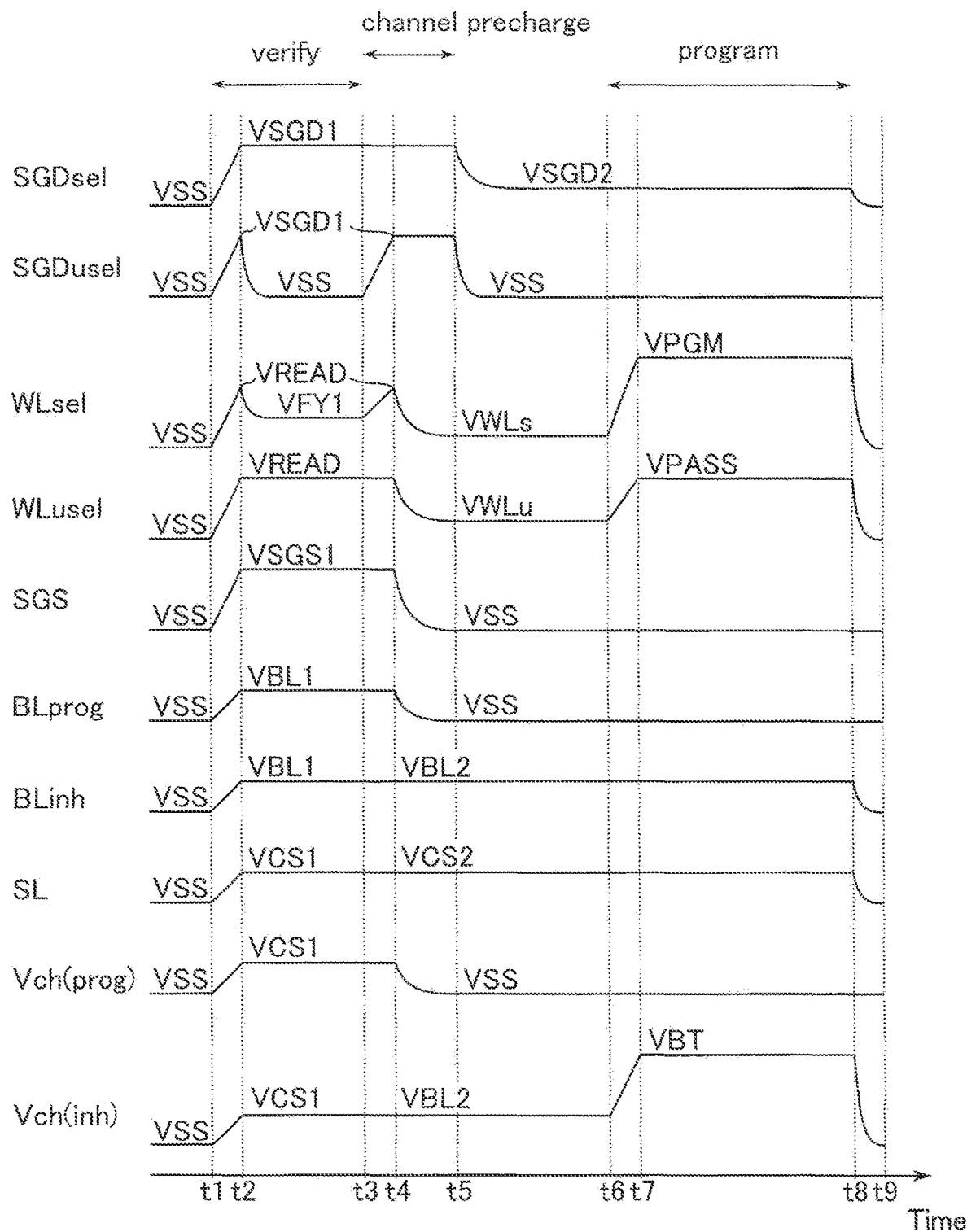
FIG. 13 is a timing chart showing voltages of various interconnects, etc. in a write operation of a semiconductor memory device according to a seventh embodiment.

Voltages of various interconnects, etc. in a write operation will be described with reference to FIG. 13. FIG. 13 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the bit line BL in a state where the memory cell transistors MC0 and MC1 have been programmed and the memory cell transistors MC2 to MC7 have not been programmed. Hereinafter, the case where the threshold voltages of the memory cell transistors MC0 and MC1 are positive voltages will be described to simplify the description.

In the i-th program loop, after a program operation is executed, the voltages of various interconnects, etc. are controlled so that a verify operation is executed, as in the period from time t1 to time t3 in the fifth embodiment shown in FIG. 10. After the verify operation is executed, a channel precharge operation is executed. Control of the voltages of various interconnects, etc. in the channel precharge operation is performed as follows.

(Channel Precharge Operation)

In the period from time t3 to time t4, the voltages of various interconnects are similar to those in the fifth embodiment. In the period from time t4 to time t5, the row decoder module 15 applies the voltage VWLs to the word line WLsel. The row decoder module 15 applies the voltage VWLu to the word line WLusel. The voltages of the other interconnects are similar to those in the fifth embodiment.

In the period from time t4 to time t5, the voltage of the word line WLsel changes to the voltage VWLs. The voltage of the word line WLusel changes to the voltage VWLu. The voltages of the select gate line SGS and bit line BLprog change to the voltage VSS.

In the NAND string NSprog, the select transistor ST1 is turned on by the voltage VSGD1 being applied to the select gate line SGDsel. The select transistor ST2 is turned off by the voltage VSS being applied to the select gate line SGS. The non-programmed memory cell transistors MC2 to MC7 are turned on and the programmed memory cell transistors MC0 and MC1 are turned off by the voltage VWLs being applied to the word line WLsel and the voltage VWLu being applied to the word line WLusel. As a result, in the NAND string NSprog, the voltage VSS is applied from the bit line BLprog to the channels of the select transistor ST1 and memory cell transistors MC2 to MC7. Accordingly, the channel voltage Vch(prog) is precharged to the voltage VSS.

As in the NAND string NSprog, in the NAND string NSinh, the select transistor ST2 and the programmed memory cell transistors MC0 and MC1 are turned off and the select transistor ST1 and the non-programmed memory cell transistors MC2 to MC7 are turned on. Therefore, in the NAND string NSinh, the voltage VBL2 is applied from the bit line BLinh to the channels of the select transistor ST1 and memory cell transistors MC2 to MC7. Accordingly, the channel voltage Vch(inh) is precharged to the voltage VBL2.

In each NAND string NS in the unselected string unit SU, the select transistor ST2 is turned off by the voltage VSS being applied to the select gate line SGS. The select transistor ST1 is turned on. Therefore, the channel voltage of the NAND string NS coupled to the bit line BLprog in the unselected string unit SU is also precharged to the voltage VSS. The channel voltage of the NAND string NS coupled to the bit line BLinh in the unselected string unit SU is also precharged to the voltage VBL2.

After the channel precharge operation is executed, the voltages of various interconnects, etc. are controlled so that the channel precharge recovery operation, the program operation, and the program recovery operation are executed in the period from time t5 to time t9, as in the period from time t5 to time t9 in the fifth embodiment shown in FIG. 10.

[7-2] Advantageous Effects

The present embodiment has advantageous effects similar to those described in the fifth embodiment. According to the present embodiment, in the channel precharge operation, with the select transistor ST1 turned on, the voltage of the word line WLsel is changed from the voltage VFY1, which is applied in the verify operation, to the voltage VREAD, and then changed from the VREAD to the voltage VWLs (>VSS). The voltage of the word line WLusel is changed from the voltage VREAD, which is applied in the verify operation, to the voltage VWLu (>VSS). In addition, the voltage of the select gate line SGS is changed from the voltage VSGS1, which is applied in the verify operation, to the voltage VSS. The changed voltages of the word lines WLsel and WLusel are higher than the voltage VSS. In addition, the voltages of the word lines WLsel and WLusel need not be changed to the voltage VSS. Therefore, the present embodiment has advantageous effects similar to those described in the third embodiment.

The semiconductor memory device 1 according to the present embodiment can also be applied to the sixth embodiment, as a matter of course.

[8] Eighth Embodiment

The eighth embodiment will be described. The configuration of the semiconductor memory device 1 according to the present embodiment is the same as that in the fifth embodiment. The flow of a write operation is the same as that in the first embodiment shown in FIG. 4. The semiconductor memory device 1 according to the present embodiment differs from that in the fifth embodiment in that, in the channel precharge operation, the voltage of the bit line BLinh is raised from the voltage VBL1 to the voltage VBL2. Hereinafter, the points different from the fifth embodiment will be mainly described.

[8-1] Voltages of Various Interconnects, Etc. in Write Operation

Figure 14:
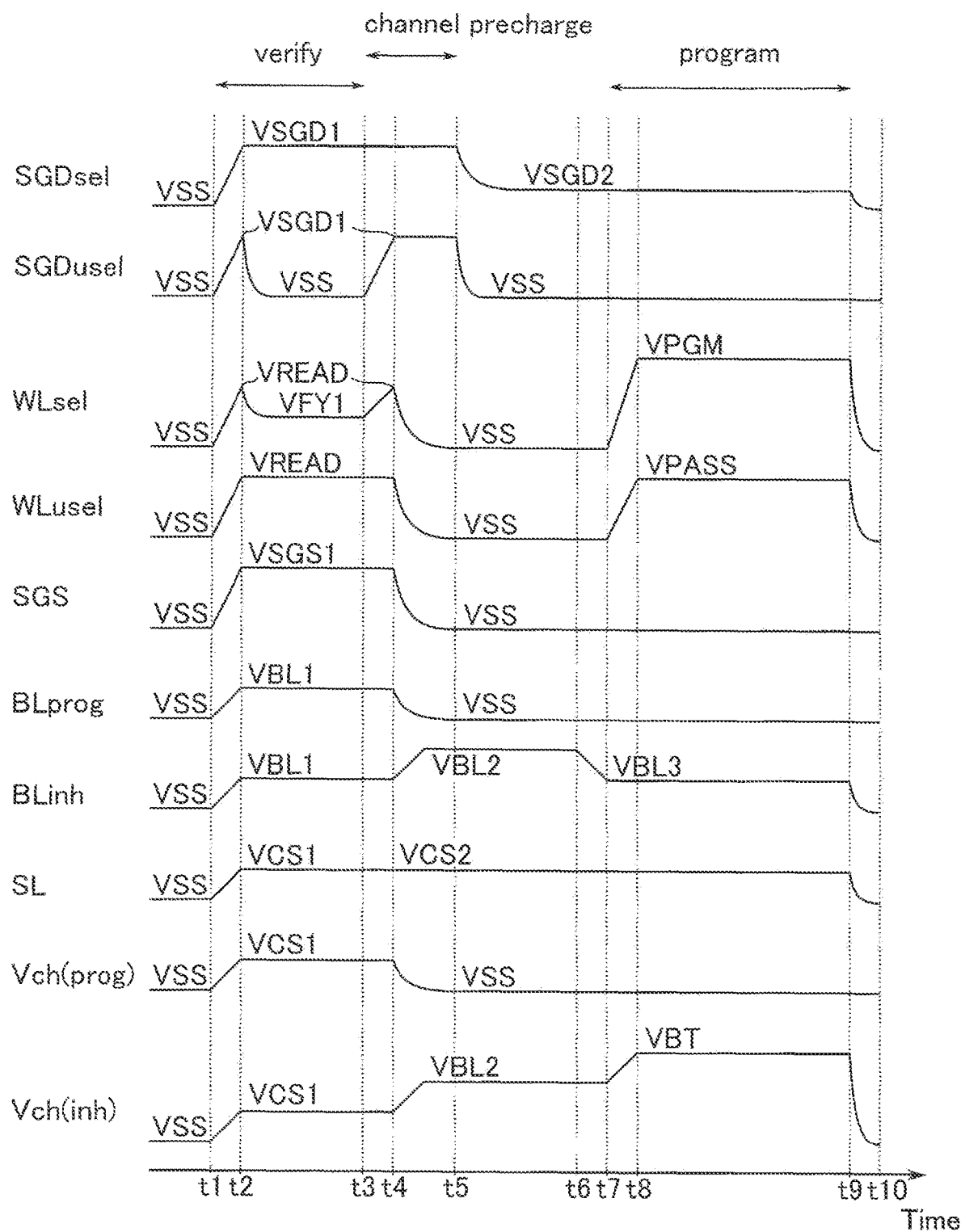
FIG. 14 is a timing chart showing voltages of various interconnects, etc. in a write operation of a semiconductor memory device according to an eighth embodiment.

Voltages of various interconnects, etc. in a write operation will be described with reference to FIG. 14. FIG. 14 is a timing chart showing voltages of various interconnects, etc. in a write operation of the semiconductor memory device 1 according to the present embodiment.

Hereinafter, the case where the sequencer 13 executes a channel precharge operation consecutively after a verify operation in the i-th program loop (where i is a natural number not less than 1) will be described. The channel precharge operation will be described while taking, as an example, the case where the channel is precharged with a voltage from the bit line BL in a state where the memory cell transistors MC0 and MC1 have been programmed and the memory cell transistors MC2 to MC7 have not been programmed.

Hereinafter, the case where the threshold voltages of the memory cell transistors MC0 and MC1 are positive voltages will be described to simplify the description.

In the i-th program loop, after a program operation is executed, the voltages of various interconnects, etc. are controlled so that a verify operation is executed, as in the period from time t1 to time t3 in the fifth embodiment shown in FIG. 10. After the verify operation is executed, a channel precharge operation is executed. Control of the voltages of various interconnects, etc. in the channel precharge operation is performed as follows.

(Channel Precharge Operation)

In the period from time t3 to time t4, the voltages of various interconnects are similar to those in the fifth embodiment. In the period from time t4 to time t5, the sense amplifier module 16 applies the voltage VBL2 to the bit line BLinh. In the present embodiment, the voltage VBL2 is higher than the voltage VBL1. The voltages of the other interconnects are similar to those in the fifth embodiment.

In the period from time t4 to time t5, the voltages of the word lines WLsel and WLusel, select gate line SGS, and bit line BLprog change to the voltage VSS.

In the NAND string NSprog, the select transistor ST1 is turned on by the voltage VSGD1 being applied to the select gate line SGDsel. The select transistor ST2 is turned off by the voltage VSS being applied to the select gate line SGS. The non-programmed memory cell transistors MC2 to MC7 are turned on and the programmed memory cell transistors MC0 and MC1 are turned off by the voltage VSS being applied to the word lines WLsel and WLusel. As a result, in the NAND string NSprog, the voltage VSS is applied from the bit line BLprog to the channels of the select transistor ST1 and memory cell transistors MC2 to MC7. Accordingly, the channel voltage Vch(prog) is precharged to the voltage VSS.

As in the NAND string NSprog, in the NAND string NSinh, the select transistor ST2 and the programmed memory cell transistors MC0 and MC1 are turned off and the select transistor ST1 and the non-programmed memory cell transistors MC2 to MC7 are turned on. Therefore, in the NAND string NSinh, the voltage VBL2 is applied from the bit line BLinh to the channels of the select transistor ST1 and memory cell transistors MC2 to MC7. Accordingly, the channel voltage Vch(inh) is precharged to the voltage VBL2.

In each NAND string NS in the unselected string unit SU, the select transistor ST2 is turned off by the voltage VSS being applied to the select gate line SGS. The select transistor ST1 is turned on. Therefore, the channel voltage of the NAND string NS coupled to the bit line BLprog in the unselected string unit SU is also precharged to the voltage VSS. The channel voltage of the NAND string NS coupled to the bit line BLinh in the unselected string unit SU is also precharged to the voltage VBL2.

At time t5, the row decoder module 15 applies the voltage VSGD2 to the select gate line SGDsel. The row decoder module 15 applies the voltage VSS to the select gate line SGDusel. The channels of the NAND string NSinh and the NAND strings NS in the unselected string unit SU are brought into the floating state by the select transistor ST1 included in the NAND string NSinh, the select transistors ST1 included in the unselected string unit SU, and the select transistors ST2 being turned off, and the channel precharge operation ends. The channel voltages of the NAND string NSprog and the NAND string NS coupled to the bit line BLprog in the unselected string unit SU are maintained at the voltage VSS. The channel voltages of the NAND string NSinh and the NAND string NS coupled to the bit line BLinh in the unselected string unit SU are maintained at the voltage VBL2.

The period from time t5 to time t7 corresponds to the precharge recovery operation. At time t6, the row decoder module 15 applies a voltage VBL3 to the bit line BLinh. The voltage VBL3 is higher than the voltage VSS and lower than the voltage VBL2. The channels of the NAND string NSinh and the NAND strings NS in the unselected string unit SU are maintained in the floating state by the select transistor ST2 being turned off. Accordingly, the channel voltages of the NAND string NSprog and the NAND string NS coupled to the bit line BLprog in the unselected string unit SU are maintained at the voltage VSS. The channel voltages of the NAND string NSinh and the NAND string NS coupled to the bit line BLinh in the unselected string unit SU are maintained at the voltage VBL2.

After the channel precharge operation is executed, in the (i+1)-th program loop, the voltages of various interconnects, etc. are controlled so that the program operation and the program recovery operation are executed in the period from time t7 to time t10, as in the period from time t6 to time t9 in the fifth embodiment shown in FIG. 10.

[8-2] Advantageous Effects

The present embodiment has advantageous effects similar to those described in the fifth embodiment. According to the present embodiment, in the channel precharge operation, with the select transistor ST1 turned on, the voltage VSS is applied to the word lines WLsel and WLusel and select gate line SGS, during which the voltage of the bit line BLinh is raised from the voltage VBL1 to the voltage VBL2. Therefore, the voltage with which the channel of each NAND string NS is precharged can be adjusted.

The semiconductor memory device 1 according to the present embodiment can also be applied to the sixth embodiment and the seventh embodiment, as a matter of course.

[9] Modifications, Etc

As described above, the semiconductor memory device according to each embodiment includes a first select transistor (ST1 or ST2), a first select gate line (SGDsel/SGDusel or SGS) coupled to the gate of the first select transistor, a first interconnect (BLprog/BLinh or SL) coupled to the first select transistor, a second select transistor (ST2 or ST1), a second select gate line (SGS or SGDsel/SGDusel) coupled to the gate of the second select transistor, a second interconnect (SL or BLprog/BLinh) coupled to the second select transistor, first and second memory cell transistors (MC) coupled between the first select transistor and the second select transistor, a first word line (WLsel) coupled to the first memory cell transistor, and a second word line (WLusel) coupled to the second memory cell transistor. In a write operation on the first memory cell transistor which includes a program operation and a program verify operation, after execution of the verify operation, in a period in which the second select transistor (ST2 or ST1) is ON, the voltage of the first word line (WLsel) changes from a first voltage to a second voltage, the voltage of the second word line (WLusel) changes from a third voltage, which is applied in the verify operation, to a fourth voltage and, after the voltage of the first word line changes to the second voltage and the voltage of the second word line changes to the fourth voltage, the voltage of the second select gate line (SGS or SGDsel/SGDusel) changes from a fifth voltage to a sixth voltage which turns off the second select transistor (ST2 or ST1).

The embodiments are not limited to the above-described ones, and various modifications are possible.

Furthermore, the order of the steps in the flowchart described in the above embodiments may be altered to the extent necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first select transistor;
a first select gate line coupled to a gate of the first select transistor;
a first interconnect coupled to the first select transistor;
a second select transistor;
a second select gate line coupled to a gate of the second select transistor;
a second interconnect coupled to the second select transistor;
first and second memory cell transistors coupled between the first select transistor and the second select transistor;
a first word line coupled to the first memory cell transistor; and
a second word line coupled to the second memory cell transistor,
wherein:
during a write operation on the first memory cell transistor which includes a program operation and a verify operation, after execution of the verify operation, in a period in which the second select transistor is ON, a voltage of the first word line changes from a first voltage to a second voltage and a voltage of the second word line changes from a third voltage, which is applied in the verify operation, to a fourth voltage, and
after the voltage of the first word line changes to the second voltage and the voltage of the second word line changes to the fourth voltage, a voltage of the second select gate line changes from a fifth voltage to a sixth voltage which turns off the second select transistor.

2. The device according to claim 1, wherein the voltage of the second select gate line is maintained at the fifth voltage in the period in which the second select transistor is ON.

3. The device according to claim 1, wherein the voltage of the second select gate line changes from a seventh voltage, which is applied in the verify operation, to the fifth voltage in the period in which the second select transistor is ON and, after the voltage of the second gate line changes to the fifth voltage, the voltage of the second select gate line changes from the fifth voltage to the sixth voltage.

4. The device according to claim 1, wherein the second voltage and the fourth voltage are higher than a ground voltage.

5. The device according to claim 1, wherein while the second voltage is applied to the first word line and the fourth voltage is applied to the second word line, a voltage of the second interconnect is raised to an eighth voltage.

6. The device according to claim 1, wherein:
the second select transistor is coupled between the second interconnect and one end of the first memory cell transistor,
another end of the first memory cell transistor is coupled to one end of the second memory cell transistor,
the first select transistor is coupled between the first interconnect and another end of the second memory cell transistor, and
the write operation is performed in order of the second memory cell transistor and the first memory cell transistor.

7. The device according to claim 1, wherein:
the write operation includes a loop including the program operation and the verify operation, and
the verify operation is an n-th verify operation (where n is an integer not less than 1), and the program operation is an (n+1)-th program operation.

8. The device according to claim 1, wherein the first interconnect is a bit line, and the second interconnect is a source line.

9. The device according to claim 1, wherein the first interconnect is a source line, and the second interconnect is a bit line.

10. The device according to claim 1, wherein the first voltage is higher than the second voltage, the third voltage is higher than the fourth voltage, and the fifth voltage is higher than the sixth voltage.

11. The device according to claim 1, wherein:
a channel precharge operation is executed between a period in which the verify operation is executed and a period in which the program operation is executed, and
in a period in which the channel precharge operation is executed, the voltage of the first word line changes from the first voltage to the second voltage and the voltage of the second word line changes from the third voltage to the fourth voltage.

12. A memory system comprising:
a semiconductor memory device, and
a memory controller configured to control the semiconductor memory device,
wherein:
the semiconductor memory device includes:
an input/output circuit configured to transmit and receive data to and from the memory controller;
a control circuit configured to control the input/output circuit based on a control signal received from the memory controller;
a first select transistor;
a first select gate line coupled to a gate of the first select transistor;
a first interconnect coupled to the first select transistor;
a second select transistor;
a second select gate line coupled to a gate of the second select transistor;
a second interconnect coupled to the second select transistor;
first and second memory cell transistors coupled between the first select transistor and the second select transistor;
a first word line coupled to the first memory cell transistor; and
a second word line coupled to the second memory cell transistor,
during a write operation on the first memory cell transistor which includes a program operation and a verify operation, after execution of the verify operation, in a period in which the second select transistor is ON, a voltage of the first word line changes from a first voltage to a second voltage and a voltage of the second word line changes from a third voltage, which is applied in the verify operation, to a fourth voltage, and
after the voltage of the first word line changes to the second voltage and the voltage of the second word line changes to the fourth voltage, a voltage of the second select gate line changes from a fifth voltage to a sixth voltage which turns off the second select transistor.

13. A method of controlling a semiconductor memory device including a first select transistor, a first select gate line coupled to a gate of the first select transistor, a first interconnect coupled to the first select transistor, a second select transistor, a second select gate line coupled to a gate of the second select transistor, a second interconnect coupled to the second select transistor, first and second memory cell transistors coupled between the first select transistor and the second select transistor, a first word line coupled to the first memory cell transistor, and a second word line coupled to the second memory cell transistor, the method comprising:
during a write operation on the first memory cell transistor which includes a program operation and a verify operation:
after execution of the verify operation, in a period in which the second select transistor is ON, changing a voltage of the first word line from a first voltage to a second voltage and changing a voltage of the second word line from a third voltage, which is applied in the verify operation, to a fourth voltage; and
after changing the voltage of the first word line to the second voltage and changing the voltage of the second word line to the fourth voltage, changing a voltage of the second select gate line from a fifth voltage to a sixth voltage which turns off the second select transistor.

* * * * *